US009792860B2

(12) United States Patent
Hokazono et al.

(10) Patent No.: US 9,792,860 B2
(45) Date of Patent: Oct. 17, 2017

(54) LIGHT-EMITTING ELEMENT, DISPLAY DEVICE AND ELECTRONIC APPARATUS

(71) Applicant: Sony Corporation, Tokyo (JP)

(72) Inventors: Nobuaki Hokazono, Kanagawa (JP); Junichi Yamashita, Tokyo (JP); Yusuke Onoyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/074,320

(22) Filed: Nov. 7, 2013

(65) Prior Publication Data

US 2014/0132175 A1    May 15, 2014

(30) Foreign Application Priority Data

Nov. 14, 2012 (JP) ................ 2012-249942

(51) Int. Cl.
| | | |
|---|---|---|
| *H05B 33/00* | (2006.01) | |
| *H05B 33/08* | (2006.01) | |
| *G09G 3/3291* | (2016.01) | |
| *G09G 3/3233* | (2016.01) | |
| *H01L 27/32* | (2006.01) | |

(52) U.S. Cl.
CPC ......... *G09G 3/3291* (2013.01); *G09G 3/3233* (2013.01); *H01L 27/3262* (2013.01); *G09G 2320/045* (2013.01)

(58) Field of Classification Search
CPC .... H05B 33/00; H05B 33/08; H05B 33/0824; H01L 27/32; H01L 51/50; G09G 3/30; G09G 3/32
USPC .......... 315/228–229, 240, 315, 320
See application file for complete search history.

(56) References Cited

U.S. PATENT DOCUMENTS

| | | | |
|---|---|---|---|
| 7,345,340 B2* | 3/2008 | Hitani et al. ................ 257/335 |
| 2001/0005159 A1* | 6/2001 | Matsumoto ......... H01L 27/0629 327/536 |
| 2008/0111766 A1* | 5/2008 | Uchino ................ G09G 3/3233 345/55 |
| 2008/0291182 A1* | 11/2008 | Yamashita ........... G09G 3/3233 345/204 |
| 2009/0066615 A1* | 3/2009 | Kawasaki ............ G09G 3/3233 345/77 |
| 2010/0282617 A1* | 11/2010 | Rothberg et al. .......... 205/780.5 |
| 2014/0103415 A1* | 4/2014 | Aebischer ....... H01L 21/823892 257/299 |

FOREIGN PATENT DOCUMENTS

JP    2008-287141 A    11/2008

* cited by examiner

*Primary Examiner* — Jimmy Vu
*Assistant Examiner* — Henry Luong
(74) *Attorney, Agent, or Firm* — Chip Law Group

(57) ABSTRACT

A light-emitting element includes a light-emitting section and a driving circuit that drives the light-emitting section. The driving circuit includes at least (A) a drive transistor that is a p-channel field effect transistor, (B) an image-signal writing transistor that is a p-channel field effect transistor, (C) a light-emission control transistor that is a p-channel field effect transistor, and (D) a capacitor. Each of the drive transistor, image-signal writing transistor, and light-emission control transistor is provided in an n-type well formed in a p-type silicon semiconductor substrate. A first source/drain region of the drive transistor is electrically connected to the n-type well in which the drive transistor is formed.

6 Claims, 14 Drawing Sheets

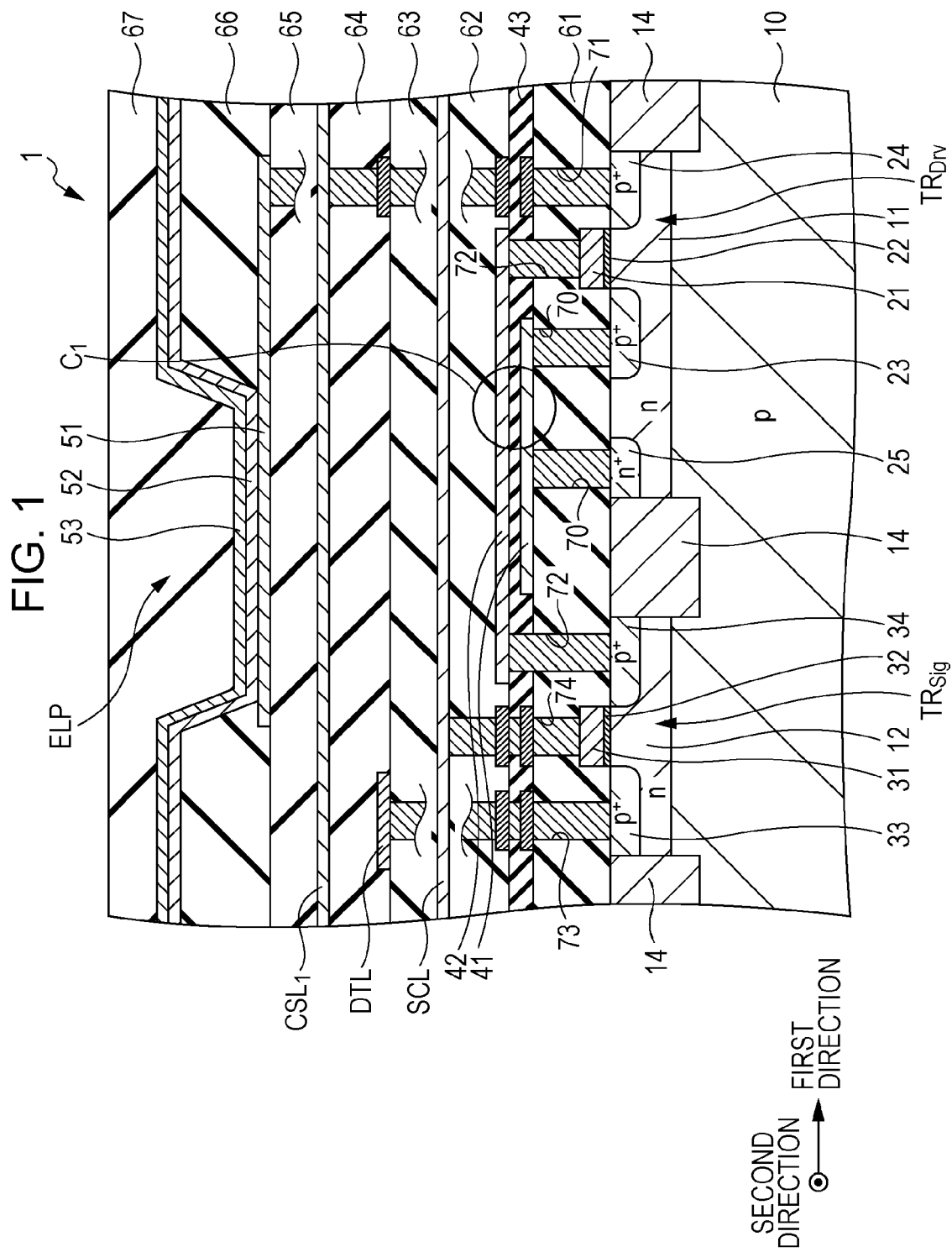

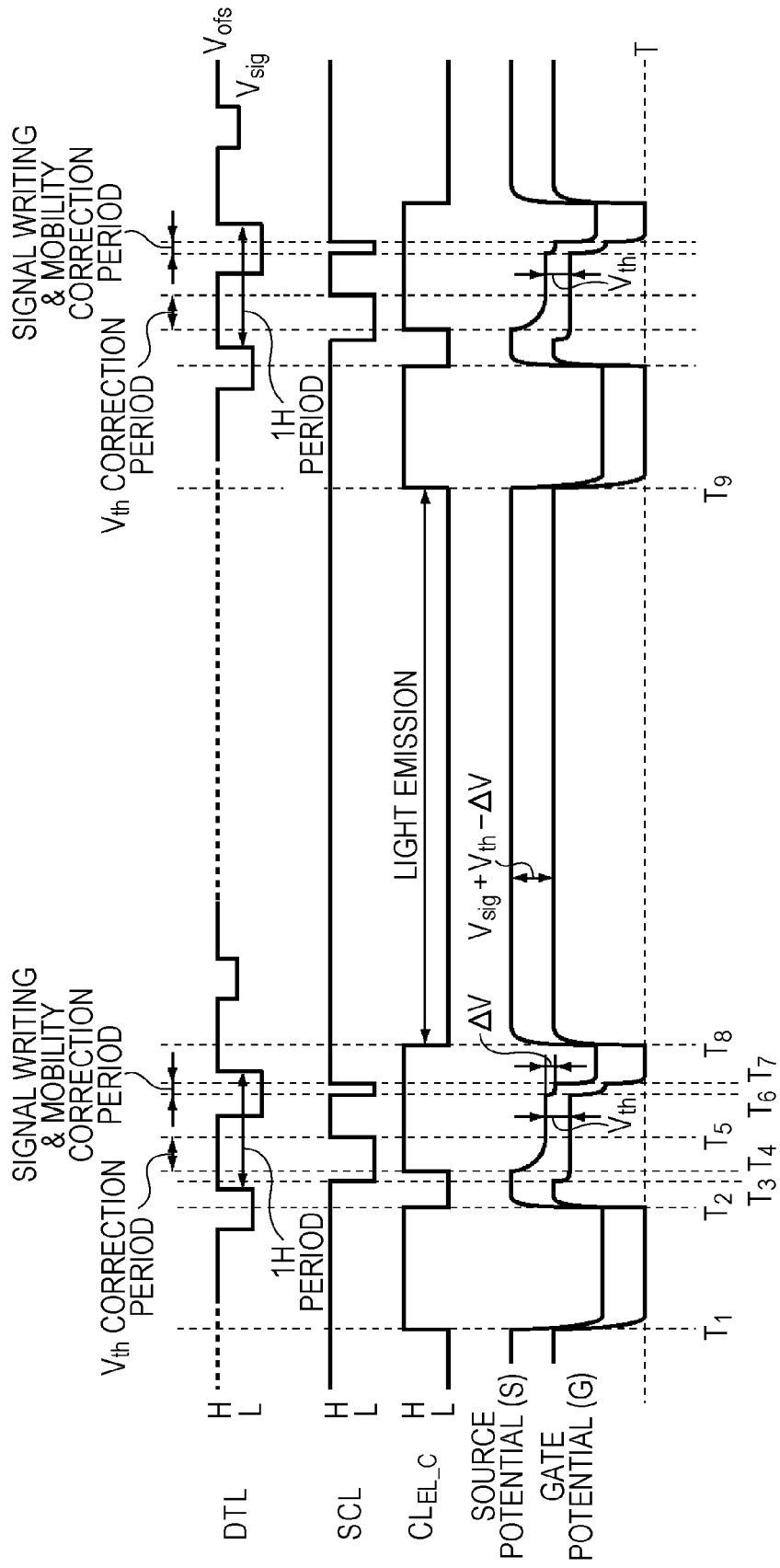

LIGHT-EMITTING ELEMENT, DISPLAY DEVICE AND ELECTRONIC APPARATUS

CROSS REFERENCE TO RELATED APPLICATIONS

This application claims the benefit of Japanese Priority Patent Application JP 2012-249942 filed Nov. 14, 2012, the entire contents of which are incorporated herein by reference.

BACKGROUND

This disclosure relates to a light-emitting element, a display device including the light-emitting element, and an electronic apparatus including the display device.

Recently, organic electroluminescence display devices (hereinafter, sometimes simply referred to in abbreviated form as "organic EL display devices") including organic electroluminescence elements (hereinafter, sometimes simply referred to in abbreviated form as "organic EL elements") have been receiving attention as an alternative to liquid crystal display devices. An organic EL display device is of a self-luminous type and has a characteristic of low power consumption. In addition, organic EL display devices have been expected to have sufficient responsivity to high-definition and high-speed video signals, and therefore their development for practical use and commercialization are closely proceeding.

An organic EL display device includes a plurality of light-emitting elements each having a light-emitting section EL and a driving circuit for driving the light-emitting section EL. For example, the equivalent circuit diagram shown in FIG. 14 illustrates a light-emitting element including a driving circuit with three transistors and two capacitors (e.g., Japanese Unexamined Patent Application Publication No. 2008-287141). The driving circuit in FIG. 14 includes a sampling transistor $Tr_1$, a drive transistor $Tr_2$, a switching transistor $Tr_3$, a storage capacitor $C_s$, and a subsidiary capacitor $C_{sub}$. These transistors are p-channel transistors. The driving circuit is connected to a first scanning line WS, a second scanning line DS and a signal line SL. The organic EL display device thus configured can have a fixed power supply voltage, thereby allowing the frame thereof to be narrowed and extending its life. In addition, the p-channel transistors exhibit less property variation among the transistors in comparison with the case where the driving circuit includes n-channel transistors.

SUMMARY

In the technology disclosed in Japanese Unexamined Patent Application Publication No. 2008-287141, the driving circuit is formed with thin film transistors (TFT transistors). If the driving circuit is formed with field effect transistors (FETs) provided on a silicon semiconductor substrate instead of the thin film transistors, consideration should be given to the influence of the substrate effect (a phenomenon in which the threshold voltage of the transistor varies due to the potential difference between the source region S and the silicon semiconductor substrate). An approximate value of the threshold voltage $V'_{th}$ after the threshold voltage variation due to the substrate effect in the p-channel MOS transistor can be obtained by Expression (1) below.

$$V'_{th} \approx V_{th}(0) - \gamma(V_{sb})^{1/2} \tag{1}$$

In this expression, $V_{sb}$: a voltage between a source region and a silicon semiconductor substrate, $V_{th}(0)$: a threshold voltage when the voltage between the source region and silicon semiconductor substrate is 0 volts, and γ: a constant depending on doping of the silicon semiconductor substrate.

In the p-channel MOS transistor, generally, the potential of an n-type well formed in the silicon semiconductor substrate is regarded as a common substrate potential. The substrate potential is fixed at the highest potential used in the driving circuit. When the potential of the source region S of the drive transistor $Tr_2$ is constant, the voltage $V_{sb}$ between the source region S and silicon semiconductor substrate (i.e., n-type well) is constant, resulting in no substrate effect. However, the threshold voltage correction process performed on the drive transistor $Tr_2$ disclosed in Japanese Unexamined Patent Application Publication No. 2008-287141 changes the potential in the source region S of the drive transistor $Tr_2$ between the threshold voltage correction period and light emission period, thereby varying $V_{sb}$. The variation in $V_{sb}$ generates the substrate effect that affects the light emitting condition of the light-emitting section EL.

With reference to a timing diagram illustrating operation of a pixel circuit in FIG. 5, the influence of the substrate effect will be described below. In FIG. 5, "DTL" is read as "SL", "SCL" is read as "WS", and "$CL_{EL\_C}$" is read as "DS". The potential of the source region S in the drive transistor $Tr_2$ is represented by "source potential (S)", while the potential of the gate electrode is represented by "gate potential (G)". Since the transistors $Tr_1$, $Tr_3$ are p-channel transistors, these transistors enter an on state when signals on the first scanning line WS, second scanning line DS, and signal line SL are at a low level (L), while the transistors enter an off state when the signals are at a high level (H).

In FIG. 5, during a threshold voltage correction period from time $T_4$ to time $T_5$, the gate potential (G) of the drive transistor $Tr_2$ is maintained at a reference voltage $V_{ofs}$, while the source region S of the drive transistor $Tr_2$ discharges. At this point, the source potential (S) of the drive transistor $Tr_2$ keeps decreasing until reaching a potential where the drive transistor $Tr_2$ is cut off. In an ideal case (where the substrate effect is not produced), the source potential (S) at which the drive transistor $Tr_2$ is cut off is $$V_{ofs} + V_{th}(0).$$

However, in reality, the substrate effect is produced and the threshold voltage enhancement takes place with reduction in the source potential (S) as shown by Expression (1) below. The source potential (S) at which the drive transistor $Tr_2$ is cut off is $$V_{ofs} + V_{th}(0) + \Delta V_{th} \tag{1}$$

where $\Delta V_{th}$ is changes in the threshold voltage caused by the substrate effect. Then, when light emission starts at time $T_8$, the switching transistor $Tr_3$ enters an on state to raise the source potential (S) of the drive transistor $Tr_2$ to the power supply voltage $V_{CC}$; however, the threshold voltage of the drive transistor $Tr_2$ at this point is $V_{sb}$=0 volts and therefore the value of $\Delta V_{th}$ in Expression (1) is zero.

The operation described above can be represented by the following saturation current expression of the transistor.

Given that there are two drive transistors $Tr_2$, the threshold voltages $V_{th}(0)$ of the two drive transistors $Tr_2$ are expressed by $V_{th-1}(0)$ and $V_{th-2}(0)$, respectively [where $V_{th-1}(0) < V_{th-2}(0)$]. In addition, a voltage that is to be applied to a gate electrode of the drive transistor $Tr_2$ to correct the threshold voltage is referred to as gate potential (G) and represented by $V_{ofs}$.

If the switching transistor $Tr_3$ is brought into an off state at time $T_4$, the source region S of the drive transistor $Tr_2$ discharges and consequently the source potential (S) decreases, thereby cutting off the drive transistor $Tr_2$. In the case where there is no substrate effect, the source potentials (S) of the two drive transistors $Tr_2$ at the completion of the threshold voltage correction process are expressed by Expression (2-1) and Expression (2-2), respectively. The potential differences $V_{gs-1}$, $V_{gs-2}$ between the gate electrode and source region S at this point can be expressed by Expression (3-1) and Expression (3-2) based on Expression (2-1) and Expression (2-2).

$$V_{s-1} = V_{ofs} + V_{th-1}(0) \tag{2-1}$$

$$V_{s-2} = V_{ofs} + V_{th-2}(0) \tag{2-2}$$

$$V_{gs-1} = V_{th-1}(0) \tag{3-1}$$

$$V_{gs-2} = V_{th-2}(0) \tag{3-2}$$

If light emission operation starts in this state, the drain currents $I_{ds}$ of the drive transistors $Tr_2$ to the light-emitting section EL are expressed by Expression (4-1) and Expression (4-2); however, their values are zero from Expression (3-1) and Expression (3-2) and, in other words, variations in the threshold voltages, i.e., variations in $V_{th-1}(0)$ and $V_{th-2}(0)$, are corrected (canceled) Note that "$\mu$" denotes effective mobility of the drive transistors $Tr_2$.

$$I_{ds-1} = k \cdot \mu \cdot [V_{gs-1} - V_{th-1}(0)]^2 \tag{4-1}$$

$$I_{ds-2} = k \cdot \mu \cdot [V_{gs-2} - V_{th-2}(0)]^2 \tag{4-2}$$

When
L: channel length,
W: channel width, and
$C_{ox}$: (relative dielectric constant of gate insulating layer)× (dielectric constant of vacuum)/(thickness of gate insulating layer),
$k \equiv (1/2) \cdot (W/L) \cdot C_{ox}$.

In the case where substrate effect is produced, the source potentials (S) are affected by the substrate effect during the threshold voltage correction process. The source potentials (S) at the completion of the threshold voltage correction process are expressed by Expression (2-1') and Expression (2-2') below.

$$V_{s-1}' = V_{ofs} + V_{th-1}(0) + \Delta V_{th-1} \tag{2-1'}$$

$$V_{s-2}' = V_{ofs} + V_{th-2}(0) + \Delta V_{th-2} \tag{2-2'}$$

In the above expressions, $\Delta V_{th-1}$ and $\Delta V_{th-2}$ denote changes in the threshold voltage caused by the substrate effect. $V_{gs-1}$, $V_{gs-2}$ at this point can be expressed by Expression (3-1') and Expression (3-2') based on Expression (2-1') and Expression (2-2'), respectively.

$$V_{gs-1} = V_{th-1}(0) + \Delta V_{th-1} \tag{3-1'}$$

$$V_{gs-2} = V_{th-2}(0) + \Delta V_{th-2} \tag{3-2'}$$

If light emission operation starts in this state, the drain currents $I_{ds}$ of the drive transistors $Tr_2$ to the light-emitting section EL are expressed by Expression (4-1') and Expression (4-2') below; however their values are not zero, unlike Expression (4-1) and Expression (4-2) and, in other words, variations in the threshold voltage are not corrected (canceled)

$$\begin{aligned} I_{ds-1} &= k \cdot \mu \cdot [V_{gs-1} - V_{th-1}(0)]^2 \\ &= k \cdot \mu \cdot [\Delta V_{th-1}]^2 \end{aligned} \tag{4-1'}$$

$$\begin{aligned} I_{ds-2} &= k \cdot \mu \cdot [V_{gs-2} - V_{th-2}(0)]^2 \\ &= k \cdot \mu \cdot [\Delta V_{th-2}]^2 \end{aligned} \tag{4-2'}$$

$$\begin{aligned} \Delta T_{ds} &= I_{ds-1} - I_{ds-2} \\ &= k \cdot \mu \cdot \{[\Delta V_{th-1}]^2 - [\Delta V_{th-2}]^2\} \end{aligned}$$

In other words, even if the threshold voltage correction process is performed, the drain current $I_{ds}$ still varies only by $\Delta I_{ds}$ due to the substrate effect. As a consequence, it can be said that there are some problems, such as obvious differences in luminance among pixels and loss of screen uniformity.

In view of the foregoing, it is desirable to provide a light-emitting element having a configuration and structure less susceptible to the substrate effect, a display device including the light-emitting element, and an electronic apparatus including the display device.

An embodiment of the present disclosure is directed to a light-emitting element including a light-emitting section and a driving circuit for driving the light-emitting section, wherein the driving circuit includes at least (A) a drive transistor that is a p-channel field effect transistor, (B) an image-signal writing transistor that is a p-channel field effect transistor, (C) a light-emission control transistor that is a p-channel field effect transistor, and (D) a capacitor, wherein each of the drive transistor, image-signal writing transistor, and light-emission control transistor is provided in an n-type well formed in a p-type silicon semiconductor substrate, and a first source/drain region of the drive transistor is electrically connected to the n-type well in which the drive transistor is formed.

Another embodiment of the present disclosure is directed to a display device with a plurality of the light-emitting elements of the above embodiment, the light-emitting elements being arranged in a two-dimensional matrix. Yet another embodiment of the present disclosure is directed to an electronic apparatus including the display device of the above embodiment.

In the light-emitting element of the embodiment of the present disclosure, the light-emitting element included in the display device of the embodiment of the present disclosure, and the light-emitting element included in the electronic apparatus of the embodiment of the present disclosure (hereinafter, these light-emitting elements are collectively referred to as "light-emitting element and so forth of the present disclosure"), the first source/drain region, which is one of the source/drain regions of the drive transistor, is electrically connected to the n-type well in which the drive transistor is formed. With this configuration, when the potential of the first source/drain region of the drive transistor rises or the voltage thereof increases, the potential of the n-type well rises or the voltage thereof increases. Accordingly, it is possible to suppress the occurrence of substrate effect (also referred to as back gate effect or substrate bias effect), to achieve stable operation of the driving circuit, and to suppress an increase in power consumption of the display device or the electronic apparatus.

BRIEF DESCRIPTION OF THE DRAWINGS

FIG. 1 is a schematic cross-sectional view partially showing a light-emitting element with a driving circuit therein, mounted in a display device or a display device provided in an electronic apparatus of Example 1.

FIG. 5 is a timing diagram schematically illustrating operation of the driving circuit according to Example 1.

Following FIG. 6D, FIGS. 7A, 7B, 7C, 7D and 7E are diagrams schematically showing the on/off state and the like of respective transistors which form the driving circuit of Example 1.

Following FIG. 10D, FIGS. 11A, 11B, 11C and 11D are diagrams schematically showing the on/off state and the like of respective transistors which form the driving circuit of Example 3.

Following FIG. 11D, FIGS. 12A, 12B, and 12C are diagrams schematically showing the on/off state and the like of respective transistors which form the driving circuit of Example 3.

DETAILED DESCRIPTION OF EMBODIMENTS

Figure 2A:
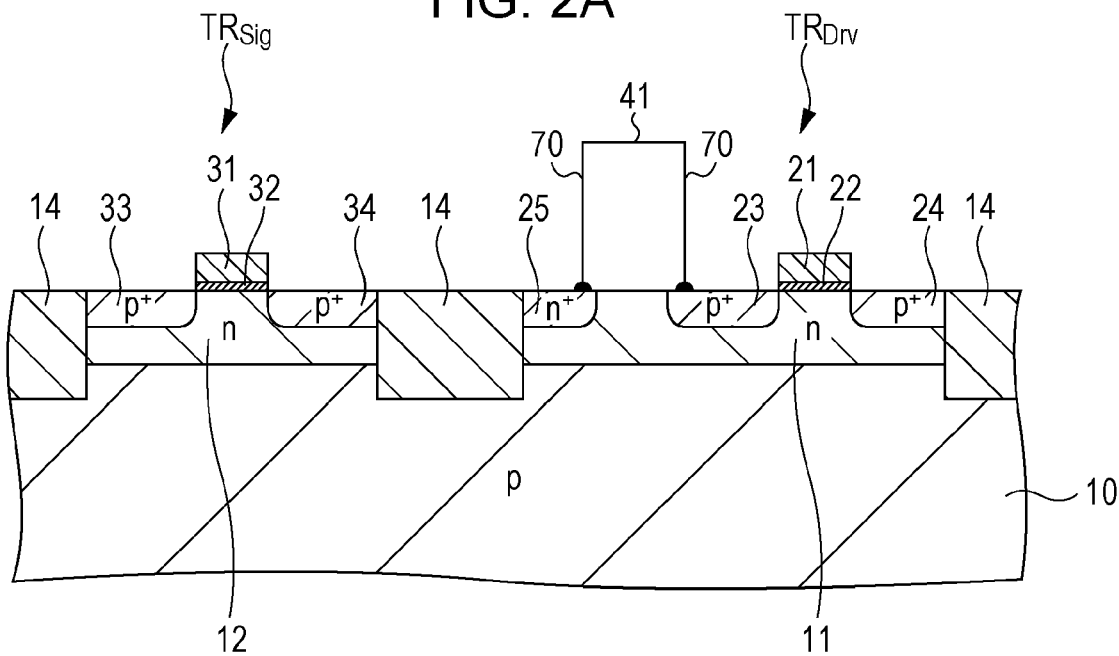
FIGS. 2A and 2B are schematic cross-sectional views each partially showing an extracted part of a drive transistor and an image-signal writing transistor in a driving circuit mounted in a display device or a display device provided in an electronic apparatus of Examples 1 and 2.

The present disclosure will be described below in connection with examples with reference to the drawings; however, the present disclosure is not limited to the examples, and various numerical values and materials in the examples are for illustration. The description will be given in the following order.

1. Overall description of a light-emitting element, a display device, and an electronic apparatus according to the present disclosure.
2. Example 1 (a light-emitting element, a display device, and an electronic apparatus according to the present disclosure. 3Tr/2C driving circuit)
3. Example 2 (Modification of Example 1)
4. Example 3 (Modification of Example 1 or 2, 4Tr/2C driving circuit) and so forth

[Overall Description of a Light-Emitting Element, a Display Device, and an Electronic Apparatus According to the Present Disclosure]

The light-emitting element and so forth of the present disclosure include a drive transistor, an image-signal writing transistor, an image-signal writing transistor, and a capacitor, wherein the drive transistor has:

(A-1) a first source/drain region connected to a second source/drain region of the light-emission control transistor;

(A-2) a second source/drain region connected to a light-emitting section; and (A-3) a gate electrode connected to a second source/drain region of the image-signal writing transistor and also connected to a second end of the capacitor to form a first node, the image-signal writing transistor has:

(B-1) a first source/drain region connected to a data line; and (B-2) a gate electrode connected to a scanning line, the light-emission control transistor has:

(C-1) a first source/drain region connected to a current supply line; and (C-2) a gate electrode connected to a light-emission control line, and the capacitor has a first end connected to a second current supply line.

The light-emitting element and so forth according to a preferred embodiment of the present disclosure further includes a second capacitor, and the first end of the capacitor is connected to a second current supply line via the second capacitor and is also connected to the first source/drain region of the drive transistor and the second source/drain region of the light-emission control transistor.

In the light-emitting element and so forth according to the above-described preferred embodiment of the present disclosure, the n-type well in which the drive transistor is formed is referred to as "a first well", the n-type well in which the image-signal writing transistor is formed is referred to as "a second well", and the n-type well in which the light-emission control transistor is formed is referred to as "a third well", for convenience. Although the image-signal writing transistor is formed in the second well in this description, it is preferable for the second well to be at the same potential in all the light-emitting elements. Sometimes, the current supply line is referred to as "a first current supply line", and the current supply unit is referred to as "a first current supply unit", for convenience.

In a display device or a display device mounted in an electronic apparatus according to the embodiment of the present disclosure, a first current supply line is connected to a first current supply unit, a second current supply line is connected to a second current supply unit, a data line is connected to an image-signal output circuit, a scanning line is connected to a scanning circuit, and a light-emission control line is connected to a light-emission control transistor control circuit. The first current supply unit, image-signal output circuit, scanning circuit, and light-emission control transistor control circuit, or these components and the second current supply unit are usually included in the display device. The first current supply line and second current supply line can be made into a common line, and also the first current supply unit and second current supply unit can be made into a single current supply unit.

The driving circuit includes at least three transistors and one capacitor; however, more specifically, the driving circuit may be (A) a driving circuit including three transistors (a drive transistor, an image-signal writing transistor, and a light-emission control transistor) and one capacitor (referred to as "a 3Tr/1C driving circuit"), (B) a driving circuit including three transistors (a drive transistor, an image-signal writing transistor and, a light-emission control transistor) and two capacitors (referred to as "a 3Tr/2C driving circuit"), or (C) a driving circuit including four transistors (a drive transistor, an image-signal writing transistor, a light-emission control transistor, and a second light-emission control transistor) and two capacitors (referred to as "a 4Tr/2C driving circuit"), and moreover, may be a 4Tr/1C driving circuit, a 5Tr/2C driving circuit, or a 5Tr/1C driving circuit. In addition, the light-emitting section may be specifically an organic electroluminescent light-emitting section (organic EL light-emitting section). The first source/drain region of the drive transistor and the first well are electrically connected to each other. More specifically, for example, a connection region of an n type is provided in a surface area of the first well, the connection region and the first source/drain region of the drive transistor are in contact each other directly or through a conductive material layer. Alternatively, the connection region and the first source/drain region of the drive transistor may be electrically connected to each other through a contact hole, a wiring line, or the like.

The display device or the display device mounted in the electronic apparatus according to the embodiment of the present disclosure may have a configuration for displaying so-called monochrome images or a configuration in which one pixel has a plurality of subpixels, specifically, one pixel has three subpixels of a red light-emitting subpixel, a green light-emitting subpixel, and a blue light-emitting subpixel. Additionally, the pixel may have a set of subpixels including these three kinds of subpixels and one or more kinds of subpixels (for example, a set of subpixels including a subpixel which emits white light for improving luminance, a set of subpixels including a subpixel which emits complementary color light for expanding the color reproduction range, a set of subpixels including a subpixel which emits yellow light for expanding the color reproduction range, or a set of subpixels including subpixels which emit yellow and cyan light for expanding the color reproduction range).

In the display device or the display device mounted in the electronic apparatus according to the embodiment of the present disclosure, various circuits, such as the first current supply unit, the second current supply unit, the image-signal output circuit, the scanning circuit, and the light-emission control transistor control circuit, various wiring lines, such as the first current supply line, the second current supply line, the data line, the scanning line, and the light-emission control line, and the light-emitting section may be of a common configuration or structure. Specifically, for example, the light-emitting section, which is an organic EL light-emitting section, may be formed with, for example, a first electrode (e.g., an anode electrode), an organic material layer (e.g., a layer in which a hole transport layer, a light-emitting layer, and an electron transport layer are stacked), a second electrode (e.g., a cathode electrode), and the like. The capacitor and the second capacitor, which form the driving circuit, may be formed with one electrode, another electrode, and a dielectric layer (insulating layer) interposed between these electrodes. The transistors, which form the driving circuit, are formed over a silicon semiconductor substrate, and the light-emitting section is formed, for example, above the transistors forming the driving circuit with insulating interlayers therebetween. The capacitor and second capacitor are also generally formed above the transistors forming the driving circuit with an insulating interlayer therebetween. The second source/drain region of the drive transistor is connected to the first electrode forming the light-emitting section through a contact hole, for example.

Example 1

Figure 3:
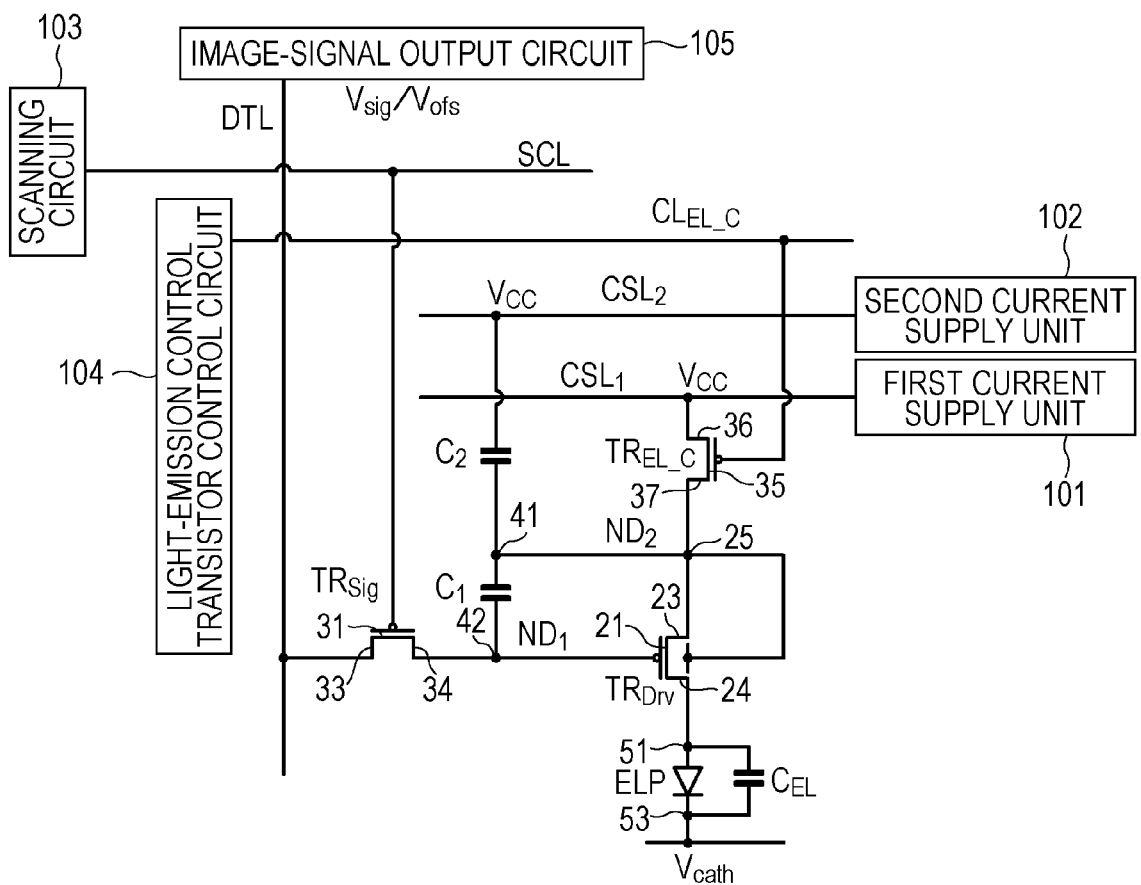
FIG. 3 is an equivalent circuit diagram of a 3Tr/2C driving circuit of Example 1.
Figure 4:
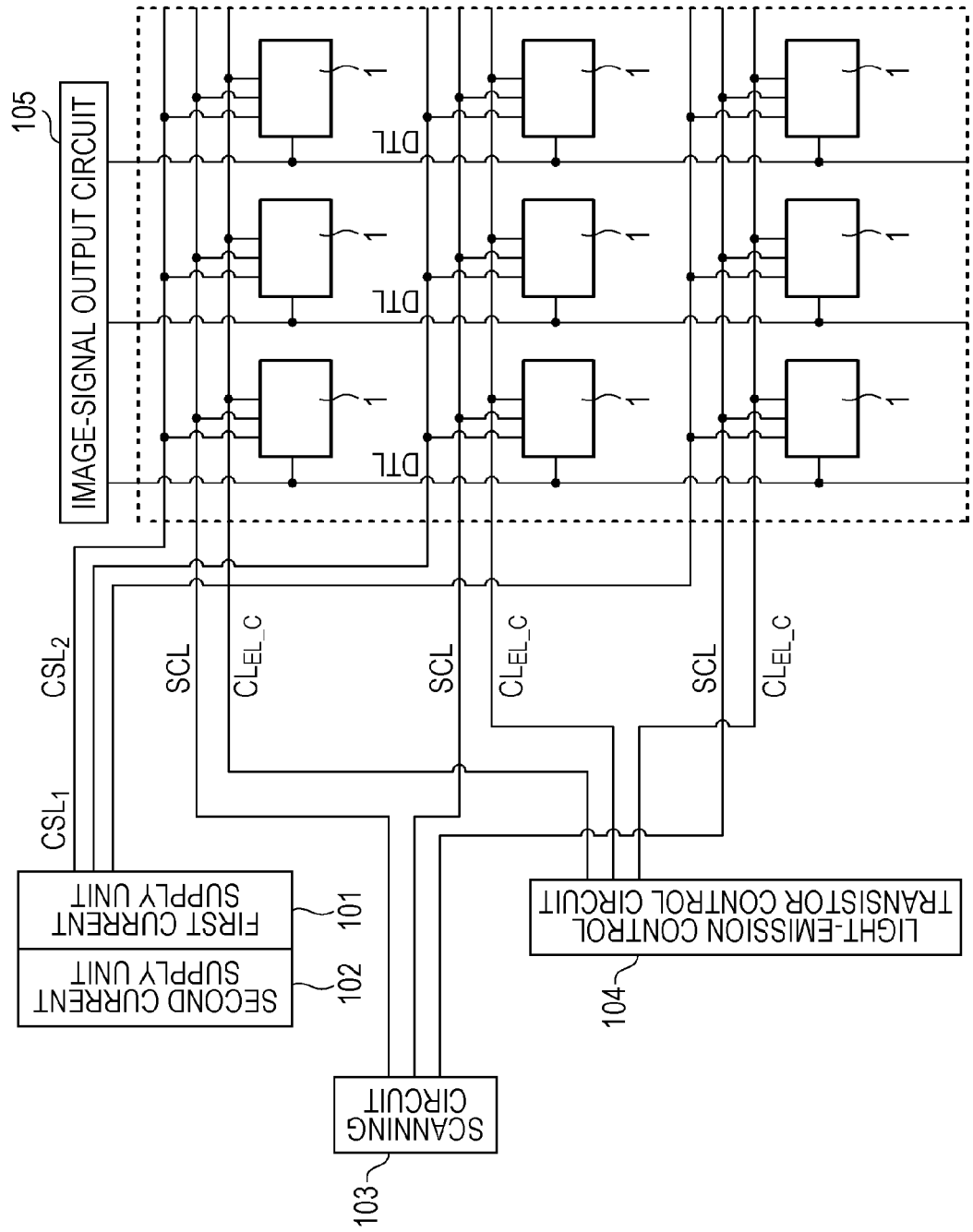
FIG. 4 is a conceptual diagram of circuits which form a display device or a display device provided in an electronic apparatus of Example 1.

Example 1 relates to a light-emitting element, a display device and an electronic apparatus according to the embodiments of the present disclosure, and specifically, to an organic EL display device and an electronic apparatus provided with the organic EL display device. Hereinafter, display devices of examples or the display devices mounted in electronic apparatuses of examples are sometimes collectively and simply referred to as "display device of examples". FIG. 1 is a schematic cross-sectional view partially showing a light-emitting element with a driving circuit therein, mounted in a display device or a display device provided in an electronic apparatus of Example 1. FIG. 2A is a schematic cross-sectional view partially showing an extracted portion of a drive transistor and an image-signal writing transistor which form the driving circuit. FIG. 3 is an equivalent circuit diagram of the light-emitting element including the driving circuit in the display device of Example 1 (the driving circuit of this example is a 3Tr/2C driving circuit with three transistors $TR_{Drv}$, $TR_{Sig}$ and $TR_{EL\_C}$ and two capacitors $C_1$ and $C_2$). FIG. 4 is a conceptual diagram of circuits that form the display device. The schematic partial cross-sectional view of FIG. 1 is made by mixing cross-sectional views of the display device taken along different vertical virtual planes for simplification of the drawing.

The display device of Example 1 includes a plurality of light-emitting elements 1 of Example 1 arranged in a two-dimensional matrix. Each of the light-emitting elements 1 includes a light-emitting section (specifically, an organic EL light-emitting section) ELP and a driving circuit for driving the light-emitting section ELP. The display device has N×M pixels arranged in a two-dimensional matrix. One pixel has three subpixels (a red light-emitting subpixel which emits red light, a green light-emitting subpixel which emits green light, and a blue light-emitting subpixel which emits blue light). The electronic apparatus of Example 1 includes the display device of Example 1.

As shown in the conceptual circuit diagram in FIG. 4, the display device of Example 1 includes:

(a) a first current supply unit 101;

(b) a second current supply unit 102;

(c) a scanning circuit 103;

(d) a light-emission control transistor control circuit 104; and (e) an image-signal output circuit 105; and further includes:

(f) N×M light-emitting elements 1 in total of N light-emitting elements 1 in a first direction and M light-emitting elements 1 in a second direction different from the first direction (specifically, a direction perpendicular to the first direction) arranged in a two-dimensional matrix;

(g) M current supply lines (first current supply lines $CSL_1$) connected to the first current supply unit 101 and extending in the first direction;

(h) M second current supply lines $CSL_2$ connected to the second current supply unit 102 and extending in the first direction;

(i) M scanning lines SCL connected to the scanning circuit 103 and extending in the first direction;

(j) M light-emission control lines $CL_{EL\_C}$ connected to the light-emission control transistor control circuit 104 and extending in the first direction; and (k) N data lines DTL connected to the image-signal output circuit 105 and extending in a second direction.

In FIG. 4, a first current supply line $CSL_1$ and a second current supply line $CSL_2$ are represented by a single line for simplification of the drawing. Although, 3×3 light-emitting elements 1 are shown in FIG. 4, this is merely for illustration. The first current supply unit 101, second current supply unit 102, scanning circuit 103, and light-emission control transistor control circuit 104 may be disposed on one end or both ends of the first current supply line $CSL_1$, second current supply line $CSL_2$, and scanning line SCL, light-emission control line $CL_{EL\_C}$, respectively.

The driving circuit in the light-emitting element 1 of Example 1 includes at least:

(A) a drive transistor $TR_{Drv}$ that is a p-channel field effect transistor;

(B) an image-signal writing transistor $TR_{Sig}$ that is a p-channel field effect transistor;

(C) a light-emission control transistor $TR_{EL\_C}$ that is a p-channel field effect transistor; and (D) a capacitor (hereinafter, referred to as "a first capacitor $C_1$" for convenience).

The drive transistor $TR_{Drv}$, image-signal writing transistor $TR_{Sig}$, and light-emission control transistor $TR_{EL\_C}$ are provided in n-type wells, respectively, that are formed in a p-type silicon semiconductor substrate 10. As described above, these transistors are p-channel MOSFETs. The drive transistor $TR_{Drv}$ is provided in the first well 11, the image-signal writing transistor $TR_{Sig}$ is provided in the second well 12, and the light-emission control transistor $TR_{EL\_C}$ is provided in the third well (not shown).

A source/drain region 23 (a first source/drain region), which is one of the source/drain regions of the drive transistor $TR_{Drv}$ is electrically connected to the n-type well (first well 11) in which the drive transistor $TR_{Drv}$ is formed. Specifically, as shown in FIGS. 1 and 2A, a connection region 25 of an n⁺ type is provided in a surface area of the first well 11. The connection region 25 and the source/drain region 23 of the drive transistor $TR_{Drv}$ are electrically connected to each other through contact holes 70, a wiring line, or the like (specifically, an electrode 41 (first electrode), which is one of the electrodes of the capacitor $C_1$).

The first capacitor $C_1$ (enclosed by a circle in FIG. 1) includes the electrode (one end or first end) 41, an electrode (the other end or second end) 42, and a dielectric layer (insulating layer) 43 interposed between the electrodes 41 and 42.

The second well 12 is at the same potential in all of the light-emitting elements 1. Specifically, the second well 12 is set at a predetermined potential (which is a substrate potential, and, for example, the highest potential used in the driving circuit) through the silicon semiconductor substrate 10. The third well is also set at a predetermined potential (which is a substrate potential, and, for example, the highest potential used in the driving circuit) through the silicon semiconductor substrate 10. The drive transistor $TR_{Drv}$, image-signal writing transistor $TR_{Sig}$, and light-emission control transistor $TR_{EL\_C}$, which form the light-emitting element 1, are surrounded by isolation regions 14.

As shown in FIG. 3, the drive transistor $TR_{Drv}$ of the light-emitting element 1 of Example 1 has:

(A-1) the source/drain region 23 (first source/drain region), which is one of the source/drain regions of the drive transistor $TR_{Drv}$ connected to a source/drain region 37 (second source/drain region) of the light-emission control transistor $TR_{EL\_C}$;

(A-2) a source/drain region 24 (second source/drain region), which is the other source/drain region of the drive transistor $TR_{Drv}$, connected to the light-emitting section ELP; and (A-3) a gate electrode 21 connected to a source/drain region 34 (second source/drain region) of the image-signal writing transistor $TR_{Sig}$ and also connected to the end 42 of the first capacitor $C_1$ to form a first node $ND_1$.

The image-signal writing transistor $TR_{Sig}$ has:

(B-1) a source/drain region 33 (first source/drain region), which is one of the source/drain regions of the image-signal writing transistor $TR_{Sig}$, connected to the data line DTL; and (B-2) a gate electrode 31 connected to the scanning line SCL.

The light-emission control transistor $TR_{EL\_C}$ has:

(C-1) a source/drain region 36 (first source/drain region), which is one of the source/drain regions of the light-emission control transistor $TR_{EL\_C}$, connected to the first current supply line $CSL_1$; and (C-2) a gate electrode 35 connected to the light-emission control line $CL_{EL\_C}$.

The end 41 of the first capacitor $C_1$ is connected to the second current supply line $CSL_2$.

Furthermore, the light-emitting element 1 of Example 1 includes a second capacitor $C_2$, and the end 41 of the first capacitor $C_1$ is connected to the second current supply line $CSL_2$ through the second capacitor $C_2$ and is also connected to the source/drain region 23 of the drive transistor $TR_{Drv}$ and the source/drain region 37 of the light-emission control transistor $TR_{EL\_C}$. In other words, one end of the second capacitor $C_2$ is connected to the second current supply line $CSL_2$ and the other end of the second capacitor $C_2$ is connected to the end 41 of the first capacitor $C_1$.

The image-signal output circuit 105 switches between an image signal (a driving signal or a luminance signal) $V_{Sig}$ and a predetermined reference potential $V_{ofs}$ and supplies either one of them to the data line DTL. In addition, the first current supply unit 101 supplies a fixed potential $V_{CC}$ to the first current supply line $CSL_1$, and similarly, the second current supply unit 102 supplies a fixed potential $V_{CC}$ to the second current supply line $CSL_2$. Furthermore, the scanning circuit 103 successively supplies scanning signals to the scanning line SCL. The light-emission control transistor control circuit 104 successively supplies light-emission control signals to the light-emission control line $CL_{EL\_C}$.

As shown in FIG. 1, the source/drain region 23 (specifically, a source/drain region functioning as a source region 23 while the light-emitting section ELP is emitting light in Example 1. This applies in the following descriptions) of the drive transistor $TR_{Drv}$ is connected to the electrode 41 of the first capacitor $C_1$ through the contact holes 70 and is also connected to the source/drain region 37 (not shown in FIG. 1) of the light-emission control transistor $TR_{EL\_C}$. The source/drain region 24 (specifically, a source/drain region functioning as a drain region 24 while the light-emitting section ELP is emitting light in Example 1. This applies in the following descriptions) is connected to a first electrode 51 of the light-emitting section (organic EL light-emitting section) ELP through another contact hole and contact pad 71. The gate electrode 21 is connected to the electrode 42 of the first capacitor $C_1$ through yet another contact hole and contact pad 72 to form a first node $ND_1$ and is also connected to the source/drain region 34 (specifically, a source/drain region functioning as a drain region 34 while an image signal is being written in Example 1. This applies in the following descriptions) of the image-signal writing transistor $TR_{Sig}$.

Furthermore, as shown in FIG. 1, the source/drain region 33 (specifically, a source/drain region functioning as a source region 33 while an image signal is being written in Example 1. This applies in the following descriptions) of the image-signal writing transistor $TR_{Sig}$ is connected to the image-signal output circuit 105 through another contact hole and contact pad 73 and the data line DTL. The gate electrode 31 is connected to the scanning circuit 103 through another contact hole and contact pad 74 and the scanning line SCL.

In FIG. 1, reference numeral 14 denotes an isolation region, while reference numerals 22, 32 denote gate insulating layers. The contact holes and the contact pads 71, 72, 73, 74 are provided so as not to be short-circuited with the scanning line SCL and the first current supply line $CSL_1$ extending in the first direction. FIG. 1 shows this state.

Alternatively, in other words, the display device of Example 1 includes a plurality of light-emitting elements 1 each including a light-emitting section ELP and a driving circuit for driving the light-emitting section ELP, wherein the driving circuit includes at least:

a capacitor $C_1$;

a drive transistor $TR_{Drv}$ that is a p-channel MOSFET and drives the light-emitting section ELP based on an image signal (a driving signal or a luminance signal) $V_{Sig}$ stored in the capacitor $C_1$;

an image-signal writing transistor $TR_{Sig}$ that is a p-channel MOSFET and stores the image signal $V_{Sig}$ in the capacitor $C_1$; and a light-emission control transistor $TR_{EL\_C}$ that is a p-channel MOSFET and controls the light emission state of the light-emitting section ELP, the drive transistor $TR_{Drv}$ is formed in a first n-type well 11 formed on a p-type silicon semiconductor substrate 10, the image-signal writing transistor $TR_{Sig}$ is formed in a second n-type well 12 formed on the p-type silicon semiconductor substrate 10, the light-emission control transistor $TR_{EL\_C}$ is formed in a third n-type well formed on the p-type silicon semiconductor substrate 10, and a source/drain region 23 of the drive transistor $TR_{Drv}$ is electrically connected to the first well 11.

The drive transistor $TR_{Drv}$, image-signal writing transistor $TR_{Sig}$, and light-emission control transistor $TR_{EL\_C}$ (not shown in FIG. 1) provided on the silicon semiconductor substrate 10 are covered with an insulating interlayer 61. The electrode 41 of the first capacitor $C_1$ and the dielectric layer (insulating layer) 43 are formed on the insulating interlayer 61, and the electrode 42 of the first capacitor $C_1$ is formed on the dielectric layer (insulating layer) 43. In addition, an insulating interlayer 62 is formed over the dielectric layer (insulating layer) 43 and the electrode 42 of the first capacitor $C_1$, and the scanning line SCL is formed on the insulating interlayer 62. An insulating interlayer 63 is formed over the insulating interlayer 62 and scanning line SCL, and the data line DTL is formed on the insulating interlayer 63. An insulating interlayer 64 is formed over the insulating interlayer 63 and data line DTL, and the first current supply line $CSL_1$, second current supply line $CSL_2$ (not shown in FIG. 1) and light-emission control line $CL_{EL\_C}$ (not shown in FIG. 1) are formed on the insulating interlayer 64. An insulating interlayer 65 is formed over the insulating interlayer 64, first current supply line $CSL_1$, second current supply line $CSL_2$, and light-emission control line $CL_{EL\_C}$, and the first electrode 51, which forms the light-emitting section ELP, is formed on the insulating interlayer 65. In addition, an insulating interlayer 66 with an opening at the bottom through which the first electrode 51 is exposed is formed over the insulating interlayer 65 and first electrode 51, a hole transport layer, a light-emitting layer, an electron transport layer (an organic material layer 52 having a multilayer structure of these layers), and a second electrode 53, which form the light-emitting section ELP, are formed over the insulating interlayer 66 and first electrode 51, and an insulating layer 67 is formed on the second electrode 53. A glass plate (not shown) is bonded onto the insulating layer 67 with an adhesive layer (not shown) interposed therebetween. In some cases, it is not necessary to perform patterning of the organic material layer 52 and second electrode 53. The order of stacking the scanning line SCL, data line DTL, first current supply line $CSL_1$, second current supply line $CSL_2$, and light-emission control line $CL_{EL\_C}$ is not limited to the above-described order, and these lines can be stacked substantially in any desired order. The second electrode 53 is connected to a ground wire to which a predetermined cathode voltage $V_{cath}$ is applied. In FIG. 3, symbol $C_{EL}$ denotes parasitic capacitance of the light-emitting section ELP.

The light-emitting element 1 described above can be manufactured by common methods and also can be manufactured with common materials.

When the data line DTL is at a reference potential $V_{ofs}$, the scanning circuit 103 outputs a scanning signal to the scanning line SCL to perform a correction process (threshold voltage correction process) on the threshold voltage $V_{th}$ of the drive transistor $TR_{Drv}$. When the data line DTL is at an image signal $V_{Sig}$, the scanning circuit 103 outputs a scanning signal to the scanning line SCL to perform an image-signal writing process to write the image signal $V_{Sig}$ to the first capacitor $C_1$ and a mobility correction process to correct variations in mobility μ of the drive transistor $TR_{Drv}$. After the image signal $V_{Sig}$ is written in the first capacitor $C_1$, the light-emission control transistor control circuit 104 outputs a light-emission control signal to the light-emission control line $CL_{EL\_C}$ to allow the light-emitting section ELP to emit light.

With reference to FIG. 5 showing a timing diagram and FIGS. 6A, 6B, 6C, 6D, and FIGS. 7A, 7B, 7C, 7D, 7E schematically illustrating the operation of the driving circuit, the operation of the light-emitting element 1 of Example 1 will be described. In the description, time $T_1$ to time $T_9$ are set as a period of one field. The timing diagram shows waveforms of a scanning signal and a light-emission control signal fed to the scanning line SCL and light-emission control line $CL_{EL\_C}$ along time axis T and also shows changes in potential [gate potential (G)] at the gate electrode 21 and potential [source potential (S)] at the source region 23 of the drive transistor $TR_{Drv}$. The timing diagram also shows waveforms of an image signal $V_{Sig}$ and a reference potential $V_{ofs}$ fed to the data line DTL. As to the image signal, the image signal $V_{Sig}$ and reference potential $V_{ofs}$ are alternately switched over within one horizontal scanning period (1H period). Since the image-signal writing transistor $TR_{Sig}$ and light-emission control transistor $TR_{EL\_C}$ are p-channel MOSFETs, these transistors are in an on state while the scanning signal and light-emission control signal are at a low level (L), whereas being in an off state while the signals are at a high level (H).

The light-emitting elements which form respective pixels are driven on a line sequential basis. Specifically, light emitting elements forming respective N pixels (3×N sub-pixels) arranged on the m-th row (m=1, 2, 3, . . . , M) are simultaneously driven. In other words, the timing at which the light emitting elements forming a row emit light or not is controlled by treating the row to which the elements belong as one unit. The process for writing an image signal to each pixel forming each row may be a process (simultaneous writing process) for writing the image signal to all pixels simultaneously, or a process (sequential writing process) for sequentially writing the image signal to each pixel. Either of the signal writing processes may be appropriately selected in consideration of the configuration of the light-emitting element and driving circuit. Occasionally, various processes (a threshold voltage correction process, an image-signal writing process, and a mobility correction process described below) may be performed until a horizontal scanning period (the m-th horizontal scanning period) of each light-emitting element arranged in the m-th row ends. The image-signal writing process and the mobility correction process are necessary to be done within the m-th horizontal scanning period. On the contrary, the threshold voltage correction process and processes in preparation for the threshold voltage correction process can be performed prior to the m-th horizontal scanning period depending on the type of the light-emitting elements and driving circuit. After all of the above-mentioned processes are completed, the light-emitting sections forming the light-emitting elements arranged on the m-th row are driven to emit light. The light-emitting sections may be driven to emit light immediately after all of the above-mentioned processes are completed or after a predetermined period (e.g., a horizontal scanning period for a predetermined number of rows) elapses subsequent to the completion of the above-mentioned processes. The predetermined period can be appropriately set in accordance with the specification of the display device, the configuration of the light-emitting element and driving circuit, or the like.

[Before Time $T_1$]

Before time $T_1$ in which one field begins, the image-signal writing transistor $TR_{Sig}$ is in an off state, whereas the light-emission control transistor $TR_{EL\_C}$ is in an on state. Since the drive transistor $TR_{Drv}$ is connected to the first current supply unit 101 through the light-emission control transistor $TR_{EL\_C}$ in the on state, a drain current $I'_{ds}$ is supplied to the light-emitting section ELP according to the gate electrode/source region potential difference $V_{gs}$ (hereinafter, sometimes referred to as simply "potential difference $V_{gs}$") of the drive transistor $TR_{Drv}$. Thus, the light-emitting section ELP is emitting light in a stage before time $T_1$ (see FIG. 6A).

[Time $T_1$]

Figure 6A:
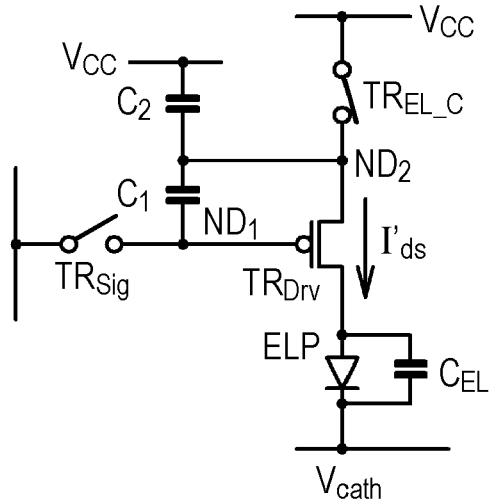
FIGS. 6A, 6B, 6C and 6D are diagrams schematically showing the on/off state and the like of respective transistors which form the driving circuit of Example 1.
Figure 6B:
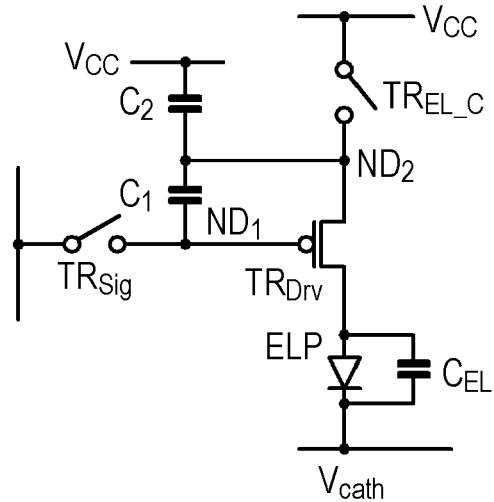

At time $T_1$, the potential on the light-emission control line $CL_{EL\_C}$ is changed from a low level to a high level (see FIG. 6B). This change brings the light-emission control transistor $TR_{EL\_C}$ into an off state to cut off the drive transistor $TR_{Drv}$ from the first current supply unit 101, thereby causing the light-emitting section ELP to enter a non-emission state.

[Time $T_2$]

Figure 6C:
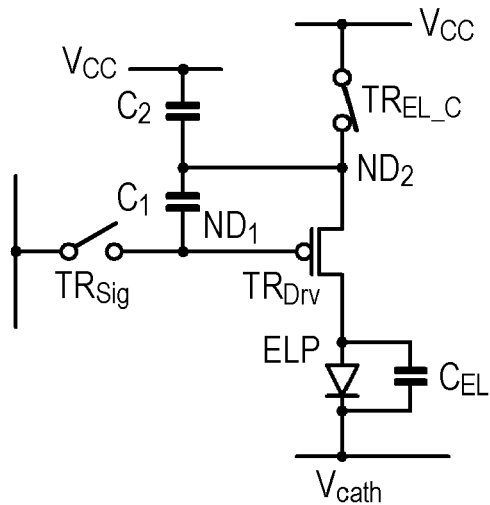
Figure 6D:
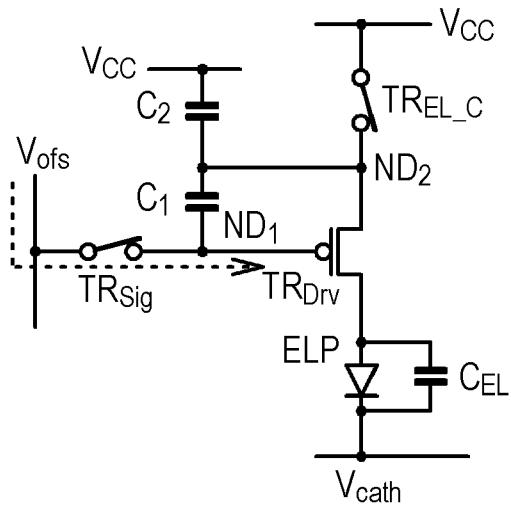

Subsequently, at time $T_2$, the potential on the light-emission control line $CL_{EL\_C}$ is changed from a high level to a low level (see FIG. 6C). This change brings the light-emission control transistor $TR_{EL\_C}$ into an on state. Consequently, the source potential (S) of the drive transistor $TR_{Drv}$ is raised to the potential $V_{CC}$. With the rise to the potential $V_{CC}$, the gate potential (G) of the drive transistor $TR_{Drv}$ is also shifted upwardly.

[Time $T_3$]

At time $T_3$, the data line DTL is at the reference potential $V_{ofs}$. Then, the potential on the scanning line SCL is changed to a low level to bring the image-signal writing transistor $TR_{Sig}$ into an on state (see FIG. 6D). Consequently, the gate potential (G) of the drive transistor $TR_{Drv}$ becomes the reference potential $V_{ofs}$. At this stage, the drive transistor $TR_{Drv}$ has a potential difference $V_{gs}$ of $(V_{CC}-V_{ofs})$ that is sufficiently larger than the threshold voltage $V_{th}$ of the drive transistor $TR_{Drv}$, and therefore the drive transistor $TR_{Drv}$ enters an on state. Note that the reference voltage $V_{ofs}$ is set so as to satisfy $(V_{CC}-V_{ofs})>|V_{th}|$. However, an unwanted current flows into the light-emitting section ELP in this state. To prevent this, it is preferable to shorten the period from time $T_3$ to time $T_4$ as much as possible and also preferable to set the value of $|V_{ofs}|$ to a value slightly larger than the value of $|V_{ofs}|$. The period from time $T_2$ to beyond time $T_3$ is the preparatory period for correcting threshold voltage. During the preparatory period, the potentials of the source region 23 and gate electrode 21 of the drive transistor $TR_{Drv}$ are reset to $V_{CC}$ and $V_{ofs}$, respectively.

[Time $T_4$]

At time $T_4$, the potential on the light-emission control line $CL_{EL\_C}$ is changed to a high level to bring the light-emission control transistor $TR_{EL\_C}$ into an off state. On the other hand, the image-signal writing transistor $TR_{Sig}$ remains in the on state (see FIG. 7A). Consequently, charges stored in the first capacitor $C_1$ and second capacitor $C_2$ are discharged through the drive transistor $TR_{Drv}$ and light-emitting section ELP. Then, the drive transistor $TR_{Drv}$ is cut off from the first current supply unit 101 with the gate potential (G) of the drive transistor $TR_{Drv}$ fixed at $V_{ofs}$, and therefore the source potential (S) of the drive transistor $TR_{Drv}$ decreases. Eventually, the current stops flowing to the drive transistor $TR_{Drv}$ at a point in time when the drive transistor $TR_{Drv}$ is cut off, that is, when the source potential (S) reaches $(V_{ofs}+|V_{th}|)$. When the drive transistor $TR_{Drv}$ is cut off, a potential difference, which is just equivalent to the threshold voltage $V_{th}$ of the drive transistor $TR_{Drv}$ is generated between the source region 23 and gate electrode 21. This potential difference is held in the first capacitor $C_1$ connected between the source region 23 and gate electrode 21 of the drive transistor $TR_{Drv}$.

[Time $T_5$]

Figure 7A:
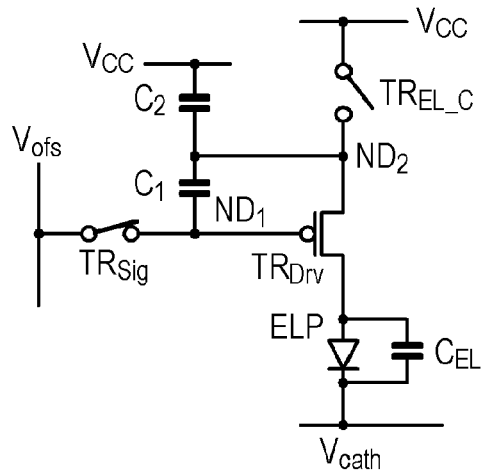
Figure 7B:
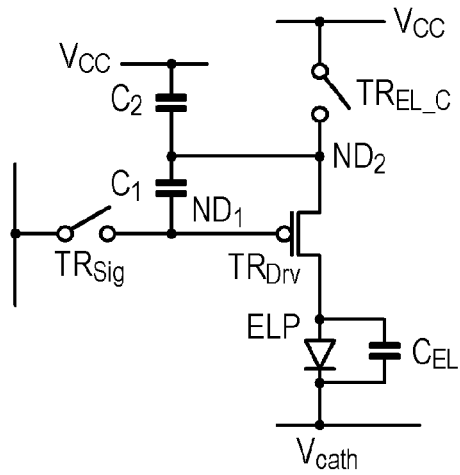

At time $T_5$, the potential on the scanning line SCL is changed to a high level to bring the image-signal writing transistor $TR_{Sig}$ into an off state (see FIG. 7B). When the gate electrode 21 of the transistor $TR_{Drv}$ is cut off from the data line DTL, the threshold voltage correction process is completed. As described above, the period from time $T_4$ to time $T_5$ is the period of the threshold voltage correction process.

[Time $T_6$]

Figure 7C:
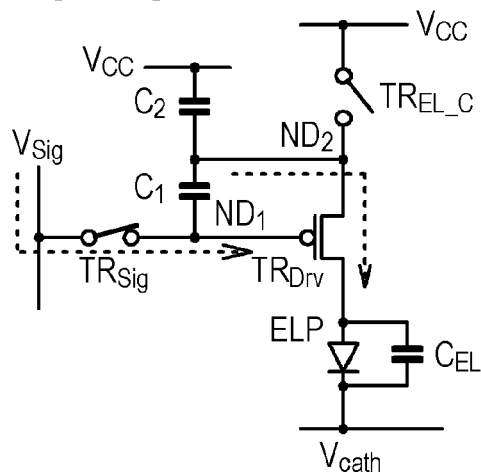
Figure 7D:
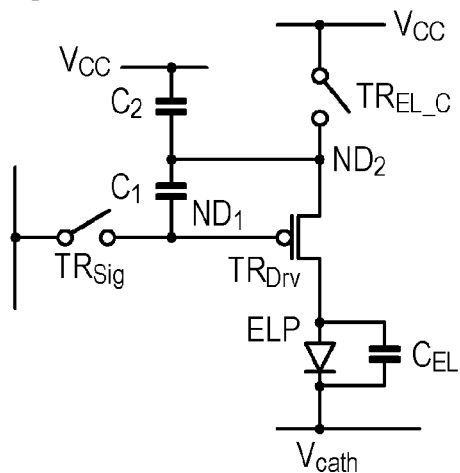
Figure 7E:
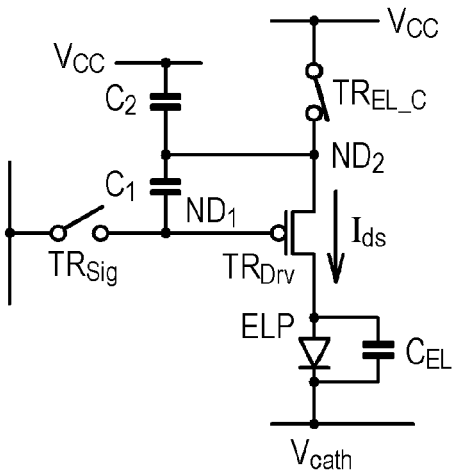

At time $T_6$, the potential on the scanning line SCL is changed to a low level to bring the image-signal writing transistor $TR_{Sig}$ into an on state (see FIG. 7C). At this point, the potential on the data line DTL is changed from the reference voltage $V_{ofs}$ to the image signal $V_{Sig}$. Consequently, the gate potential (G) of the drive transistor $TR_{Drv}$ becomes $V_{Sig}$. The potential difference $V_{gs}$ of the drive transistor $TR_{Drv}$ is expressed by the following Equation (A) based on a coupling determined by a capacitance ratio between the first capacitor $C_1$ and second capacitor $C_2$. In this description, "$C_S$" denotes the capacitance value of the first capacitor $C_1$, and "$C_{sub}$" denotes the capacitance value of the second capacitor $C_2$.

$$V_{gs}=|V_{th}|+V_{gs}' \quad (A)$$

where $$V_{gs}'=(V_{ofs}-V_{Sig})\{C_{sub}/(C_S+C_{sub})\}$$

[Time $T_7$]

Subsequently, at time $T_7$, the potential on the scanning line SCL is changed to a high level to bring the image-signal writing transistor $TR_{Sig}$ into an off state, thereby completing the writing process on the image signal $V_{Sig}$. That is, the image-signal writing process for writing the image signal $V_{Sig}$ to the gate potential (G) of the drive transistor $TR_{Drv}$ is performed in the short period from time $T_6$ to time $T_7$ in which the image-signal writing transistor $TR_{Sig}$ is in the on state. Through this process, the potential difference $V_{gs}$ at the drive transistor $TR_{Drv}$ becomes $(V_{th}+V_{Sig})$. Note that this value is effective when $V_{ofs}$ is 0 volts.

During the image-signal writing period from time $T_6$ to time $T_7$, the mobility $\mu$ of the drive transistor $TR_{Drv}$ is simultaneously corrected. The corrected mobility is expressed as $\Delta V$ in the timing diagram. Specifically, the gate potential (G) of the drive transistor $TR_{Drv}$ is $V_{Sig}$ during the image-signal writing period; however, a current flows through the drive transistor $TR_{Drv}$ at the same time and therefore the source potential (S) also changes by $\Delta V$. Properly speaking, the potential difference $V_{gs}$ at the drive transistor $TR_{Drv}$ is $(V_{th}+V_{Sig}-\Delta V)$. The change $\Delta V$ acts exactly in a direction of canceling the variation in mobility $\mu$ of the drive transistor $TR_{Drv}$. Specifically, when the mobility $\mu$ of the drive transistor $TR_{Drv}$ is relatively large, the $\Delta V$ is large, but the potential difference $V_{gs}$ correspondingly becomes small so that the effect of the mobility $\mu$ can be suppressed. On the contrary, when the drive transistor $TR_{Drv}$ has a small mobility $\mu$, the potential difference $V_{gs}$ does not become so small because the $\Delta V$ is small. Thus, the potential difference $V_{gs}$ changes depending on the magnitude of the mobility $\mu$ so that variations in the mobility $\mu$ are averaged. The time (t) for correcting the mobility is very short, like a few micro seconds. The current value $I_{ds}$ after the mobility correction is expressed by Equation (B) below.

$$I_{ds}=k\cdot\mu[V_{gs}'/\{1+(V_{gs}'\cdot k\cdot\mu\cdot t/(C_S+C_{sub}))\}] \quad (B)$$

[Time $T_8$]

At time $T_8$, the potential on the light-emission control line $CL_{EL\_C}$ is changed to a low level to bring the light-emission control transistor $TR_{EL\_C}$ into an on state. Consequently, the source region 23 of the drive transistor $TR_{Drv}$ is brought into connection with the first current supply unit 101 that in turn starts supplying current to the drive transistor $TR_{Drv}$, thereby allowing the light-emitting section ELP to start emitting light. Since the gate potential (G) of the drive transistor $TR_{Drv}$ also rises due to bootstrap effect at this moment, the potential difference $V_{gs}$ held at the first capacitor $C_1$ maintains a value of $(V_{Sig}+V_{th}-\Delta V)$.

The relationship between the drain current $I_{ds}$ and potential difference $V_{gs}$ at this moment can be expressed by Expressions (4-1) and (4-2) as described above. Since the source/drain region 23, which is one of the source/drain regions of the drive transistor $TR_{Drv}$, is electrically connected to the first well 11, there is no change in threshold voltage caused by the aforementioned substrate effect and the variation in threshold voltage is eventually corrected (canceled) In short, the drain current $I_{ds}$ to be supplied to the light-emitting section ELP is determined basically by image signals $V_{Sig}$ without depending on the threshold voltage $V_{th}$ of the drive transistor $TR_{Drv}$. In other words, the light-emitting section ELP emits light with a luminance corresponding to the image signal $V_{Sig}$.

[Time $T_9$]

Reaching time $T_9$ at last, the potential on the light-emission control line $CL_{EL\_C}$ is changed to a high level to bring the light-emission control transistor $TR_{EL\_C}$ into an off state, thereby terminating light emission and completing one field. A transition is thereafter made to the next field to repeat the threshold voltage correction process, image-signal writing process, mobility correction process, and light emitting operation again.

In the display device according to Example 1, the first source/drain region, which is one of the source/drain regions of the drive transistor that forms the driving circuit, is electrically connected to the first well. For this configuration, when the potential of the first source/drain region of the drive transistor rises or the voltage thereof increases, the potential of the first well also rises or the voltage thereof increases. Accordingly, it is possible to suppress the occurrence of the substrate effect to achieve stable operation of the driving circuit and to suppress an increase in power consumption of the display device. Since the first source/drain region of the drive transistor and the first well are electrically connected to each other, deterioration of the light-emitting section ELP causes deterioration in the I-V characteristic of the light-emitting section ELP. Therefore, even when the potential of the first electrode is raised high, no problems occur. In addition, the amplitude of voltage applied to the drive transistor $TR_{Drv}$ is about $(V_{CC}-V_{cath})$ at maximum, specifically around 10 volts, which is small enough to secure a sufficient margin for the withstand voltage of the drive transistor $TR_{Drv}$.

Example 2

Figure 2B:
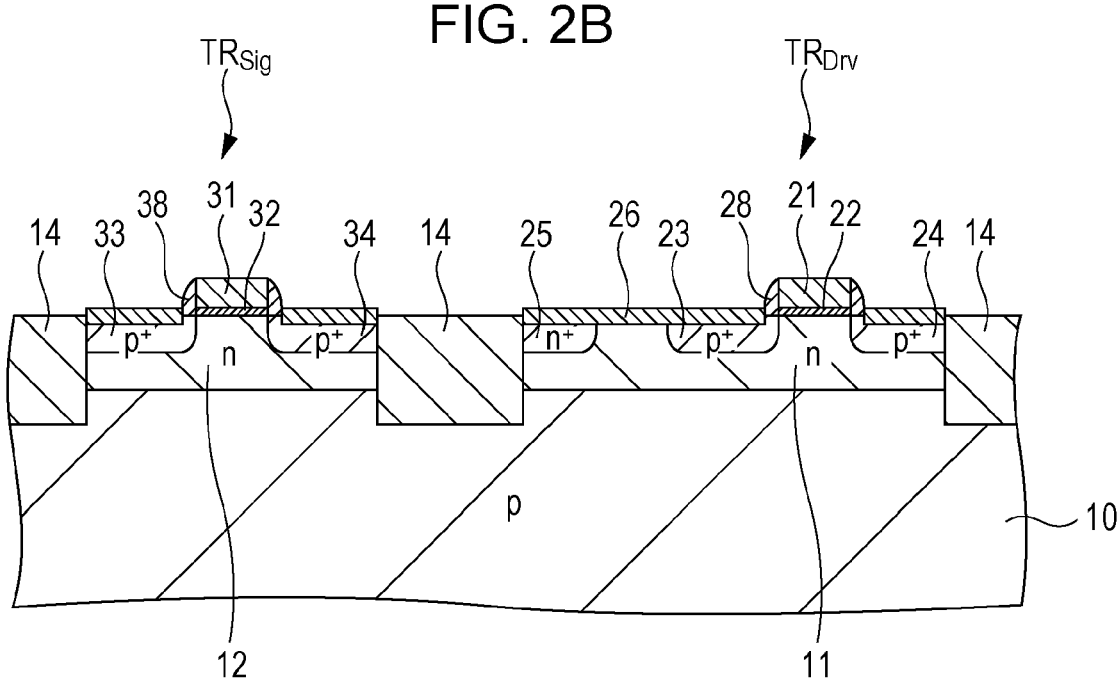

Example 2 is a modification of Example 1. FIG. 2B is a schematic cross-sectional view partially showing an extracted part of a drive transistor $TR_{Drv}$ and an image-signal writing transistor $TR_{Sig}$ that form a driving circuit in a display device of Example 2. Similar to Example 1, a connection region 25 of an n$^+$-type conductivity is provided on a surface area of a first well 11 in Example 2. A difference in Example 2 from Example 1 is that a conductive material layer 26 (specifically, metal silicide layer) is formed over the surfaces of the connection region 25 and the source region 23. With this configuration, it is possible to reliably electrically connect a first source/drain region (source region 23), which is one of the source/drain regions of the drive transistor $TR_{Drv}$, to the first well 11.

A specific formation method of the conductive material layer 26 is a self-aligned SiliCIDE (SALICIDE) process. Specifically, after the formation of a gate insulating layer 22 of the drive transistor $TR_{Drv}$, the formation of a gate electrode 21, the formation of the source/drain regions 23, 24 by ion implantation, the formation of the connection region 25 by ion implantation, and the formation of gate sidewalls 28, 38, a metal layer (e.g., cobalt layer) is formed on the entire surface. Thermal treatment performed thereafter causes a reaction between silicon atoms in the silicon semiconductor substrate 10 and metal atoms in the metal layer to form a metal silicide layer. Thus, the conductive material layer 26 is formed. The metal silicide layer may be also formed on the top surface of the gate electrode 21 at this time. Then, the metal layer which has not reacted with silicon atoms is removed, and the metal silicide layer is annealed to stabilize the metal silicide layer. In this manner, the conductive material layer 26 can be obtained that reliably electrically connects the first source/drain region (source region 23) of the drive transistor $TR_{Drv}$ and the first well 11.

Example 3

Figure 8:
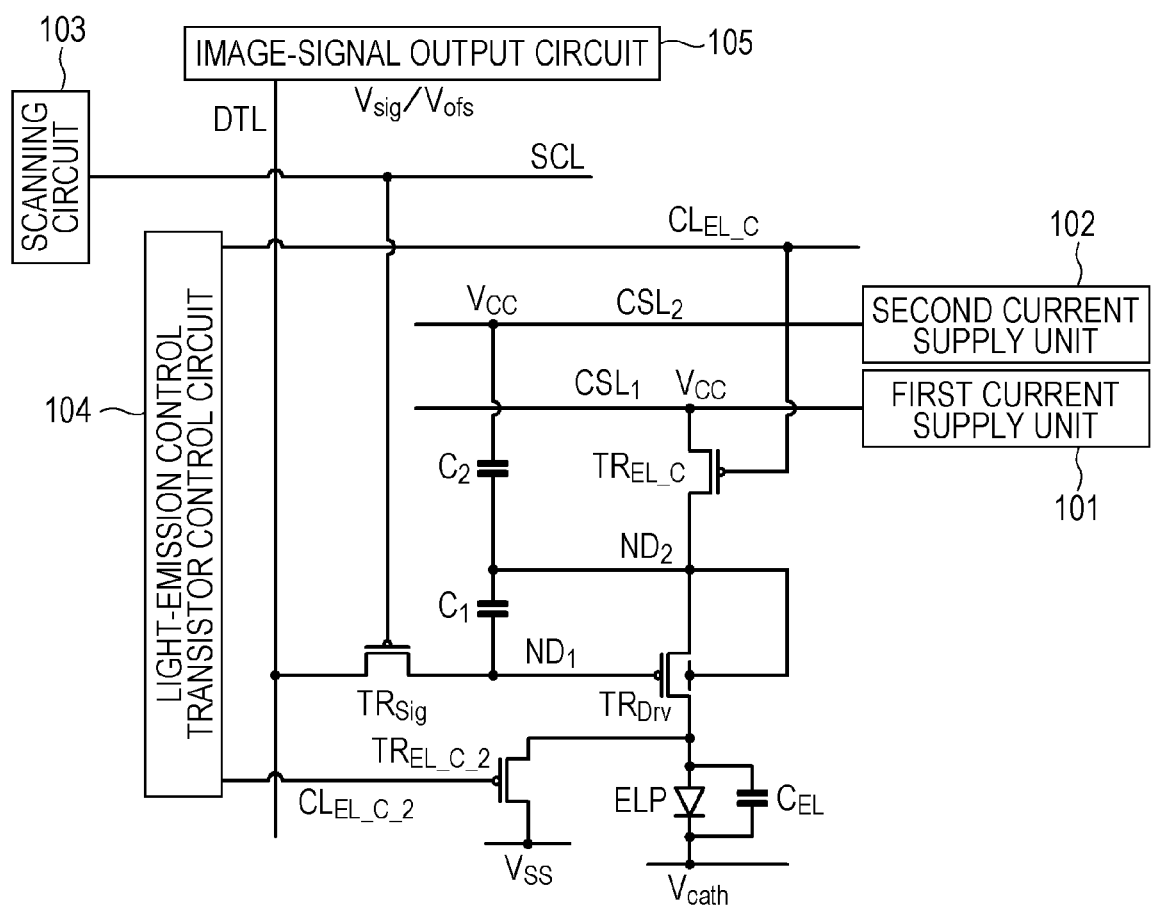
FIG. 8 is an equivalent circuit diagram of a 4Tr/2C driving circuit of Example 3.

Example 3 is a modification of Example 1 or Example 2. FIG. 8 is an equivalent circuit diagram of a light-emitting element including a driving circuit in the display device of Example 3 (the driving circuit of this example is a 4Tr/2C driving circuit with four transistors $TR_{Drv}$, $TR_{Sig}$, $TR_{EL\_C}$, $TR_{EL\_C\_2}$ and two capacitors $C_1$, $C_2$). The driving circuit of Example 3 has the same configuration and structure as those of the driving circuit of Example 1 or Example 2 except that the driving circuit includes a second light-emission control transistor $TR_{EL\_C\_2}$. In Example 3, the second light-emission control transistor $TR_{EL\_C\_2}$ has a gate electrode connected to the second light-emission control line $CL_{EL\_C\_2}$, a first source/drain region, which is one of the source/drain regions, connected to a second source/drain region (drain region 24) of the drive transistor $TR_{Drv}$, and a second source/drain region, which is the other source/drain region, having a potential $V_{SS}$. The second light-emission control line $CL_{EL\_C\_2}$ is connected to a light-emission control transistor control circuit 104.

Figure 9:
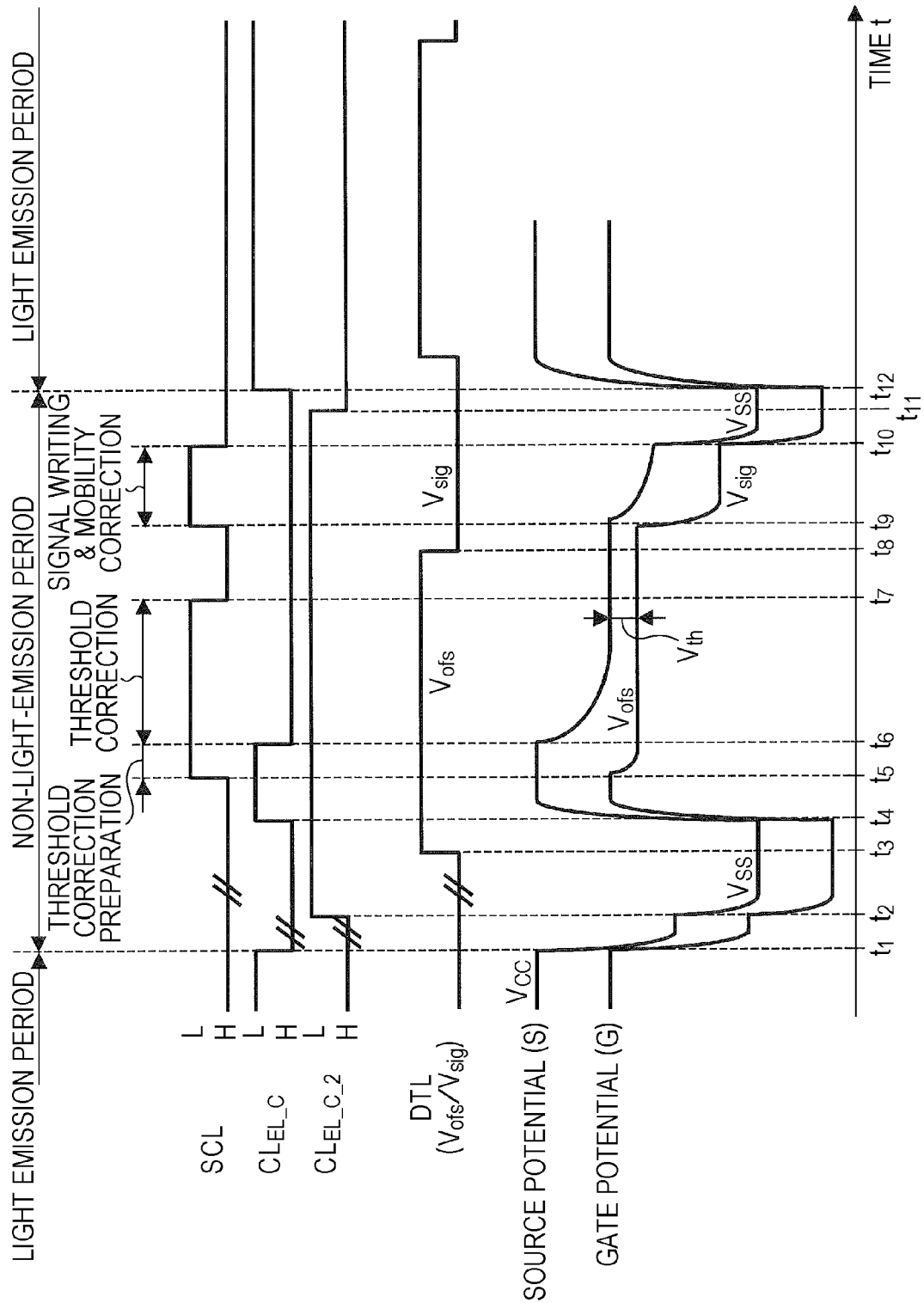
FIG. 9 is a timing diagram schematically illustrating operation of the driving circuit according to Example 3.

With reference to FIG. 9 showing a timing diagram and FIGS. 10A, 10B, 10C, 10D, FIGS. 11A, 11B, 11C, 11D, and FIGS. 12A, 12B, 12C schematically illustrating the operation of the driving circuit, the operation of the light-emitting element of Example 3 will be described.

[Before Time $t_1$]

Before time $t_1$ in which one field begins, the image-signal writing transistor $TR_{Sig}$ and the second light-emission control transistor $TR_{EL\_C\_2}$ are in an off state, whereas the light-emission control transistor $TR_{EL\_C}$ is in an on state. Since the drive transistor $TR_{Drv}$ is connected to the first current supply unit 101 through the light-emission control transistor $TR_{EL\_C}$ in the on state, a drain current $I'_{ds}$ is supplied to the light-emitting section ELP according to the potential difference $V_{gs}$ of the drive transistor $TR_{Drv}$. Thus, the light-emitting section ELP is emitting light in a stage before time $t_1$ (see FIG. 10A).

[Time $t_1$]

Figure 10A:
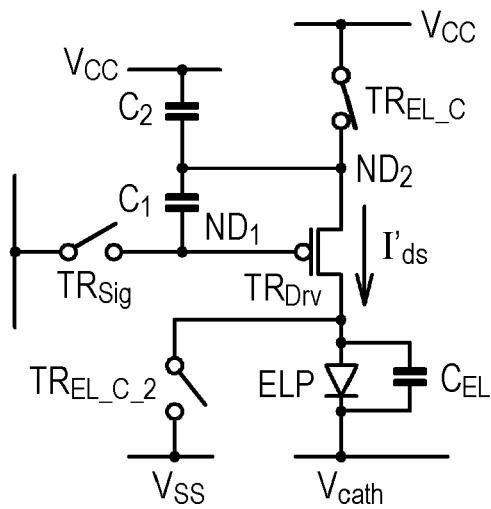
FIGS. 10A, 10B, 10C and 10D are diagrams schematically showing the on/off state and the like of respective transistors which form the driving circuit of Example 3.
Figure 10B:
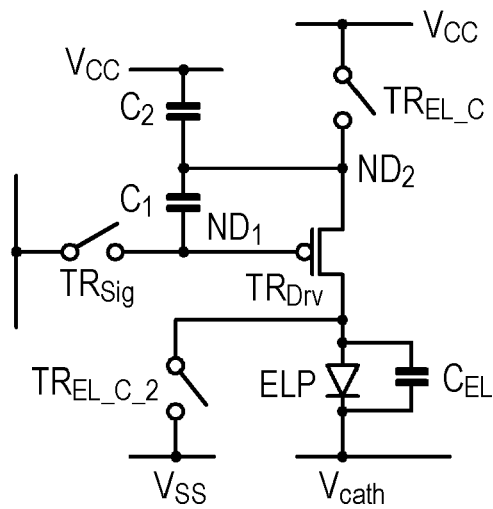

At time $t_1$, the potential on the light-emission control line $CL_{EL\_C}$ is changed from a low level to a high level (see FIG. 10B). This change brings the light-emission control transistor $TR_{EL\_C}$ into an off state to cut off the drive transistor $TR_{Drv}$ from the first current supply unit 101, thereby causing the light-emitting section ELP to enter a non-emission state.

[Time $t_2$]

Figure 10C:
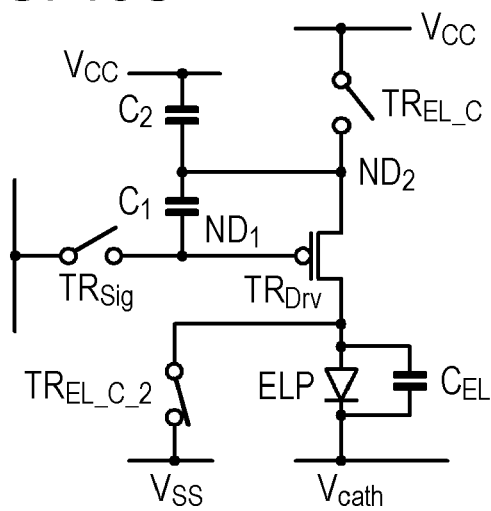

Subsequently, at time $t_2$, the potential on the second light-emission control line $CL_{EL\_C\_2}$ is changed from a high level to a low level (see FIG. 10C). This change brings the second light-emission control transistor $TR_{EL\_C\_2}$ into an on state. Consequently, the potential of a first electrode (anode electrode) 51 of the light-emitting section ELP becomes $V_{SS}$.

[Time $t_3$]

At subsequent time $t_3$, the potential on the data line DTL becomes $V_{ofs}$.

[Time $t_4$]

Figure 10D:
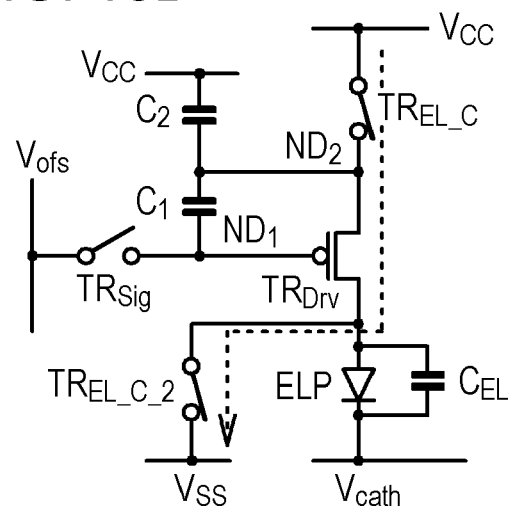

At subsequent time $t_4$, the potential on the light-emission control line $CL_{EL\_C}$ is changed from a high level to a low level (see FIG. 10D). Consequently, a current corresponding to the potential difference $V_{gs}$ of the drive transistor $TR_{Drv}$ flows through the drive transistor $TR_{Drv}$. Since the second light-emission control transistor $TR_{EL\_C\_2}$ is in the on state, the anode potential of the light-emitting section ELP remains at the potential $V_{SS}$. In Example 3, the potential $V_{SS}$ is set so as to satisfy the condition, $V_{SS} < V_{EL} + V_{cath}$. Therefore, a reverse bias is applied to the light-emitting section ELP and keeps the light-emitting section ELP in the non-emission state. Then, the current flowing through the drive transistor $TR_{Drv}$ further flows into the second light-emission control transistor $TR_{EL\_C\_2}$.

[Time $t_5$]

Figure 11A:
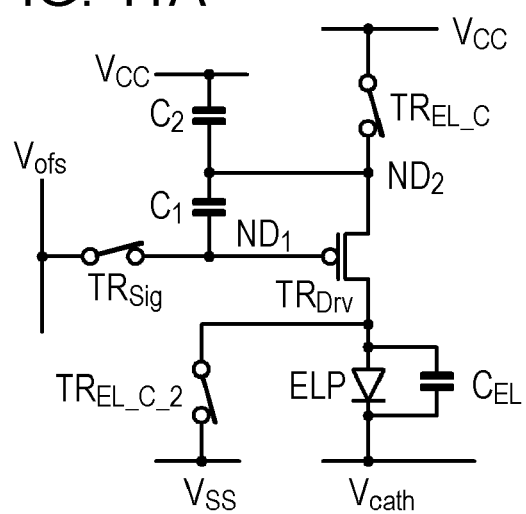

At subsequent Time $t_5$, the potential on the scanning line SCL is changed to a low level to bring the image-signal writing transistor $TR_{Sig}$ into an on state (see FIG. 11A). Consequently, the gate potential (G) of the drive transistor $TR_{Drv}$ becomes the reference potential $V_{ofs}$. In addition, the source potential (S) becomes the potential $V_{CC}$, and the potential of the drain region becomes the potential $V_{SS}$. At this stage, the drive transistor $TR_{Drv}$ has a potential difference $V_{gs}$ of $(V_{CC} - V_{ofs})$ that is sufficiently larger than the threshold voltage $V_{th}$ of the drive transistor $TR_{Drv}$, and therefore the drive transistor $TR_{Drv}$ enters an on state. As with the case of Example 1, the reference voltage $V_{ofs}$ is set so as to satisfy $(V_{CC} - V_{ofs}) > |V_{th}|$.

[Time $t_6$]

Figure 11B:
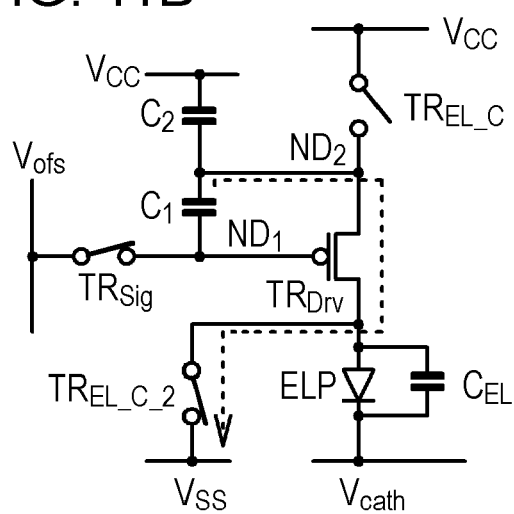

At subsequent time $t_6$, the potential on the light-emission control line $CL_{EL\_C}$ is changed from a low level to a high level (see FIG. 11B). This change brings the light-emission control transistor $TR_{EL\_C}$ into an off state. Then, a current flows from the first capacitor $C_1$ to the second light-emission control transistor $TR_{EL\_C\_2}$ via the drive transistor $TR_{Drv}$. The image-signal writing transistor $TR_{Sig}$ remains in the on state. Then, the drive transistor $TR_{Drv}$ is cut off from the first current supply unit 101 with the gate potential (G) of the drive transistor $TR_{Drv}$ fixed at $V_{ofs}$, and therefore the source potential (S) of the drive transistor $TR_{Drv}$ decreases. Eventually, the current stops flowing to the drive transistor $TR_{Drv}$ at a point in time when the drive transistor $TR_{Drv}$ is cut off, that is, when the source potential (S) reaches $(V_{ofs} + |V_{th}|)$. When the drive transistor $TR_{Drv}$ is cut off, a potential difference, which is just equivalent to the threshold voltage $V_{th}$ of the drive transistor $TR_{Drv}$, is generated between the source region and gate electrode. This potential difference is held in the first capacitor $C_1$ connected between the source region and gate electrode of the drive transistor $TR_{Drv}$.

[Time $t_7$]

Figure 11C:
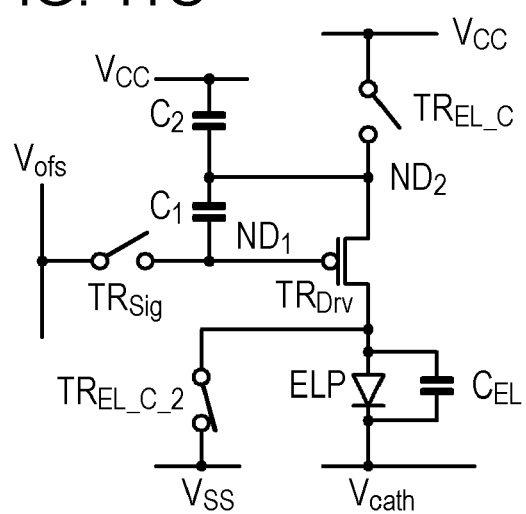

At subsequent time $t_7$, the potential on the scanning line SCL is changed to a high level to bring the image-signal writing transistor $TR_{Sig}$ into an off state (see FIG. 11C). The gate electrode of the drive transistor $TR_{Drv}$ is cut off from the data line DTL, and the threshold voltage correction process is completed. As described above, the period from time $t_6$ to time $t_7$ is the period for the threshold voltage correction process. During this period, a current flows from the first capacitor $C_1$ to the second light-emission control transistor $TR_{EL\_C\_2}$ via the drive transistor $TR_{Drv}$. This decreases the source potential (S) of the drive transistor $TR_{Drv}$ with the passage of time.

[Time $t_8$]

At subsequent time $t_8$, the potential on the data line DTL is changed from the reference potential $V_{ofs}$ to the image signal $V_{Sig}$

[Time $t_9$]

Figure 11D:
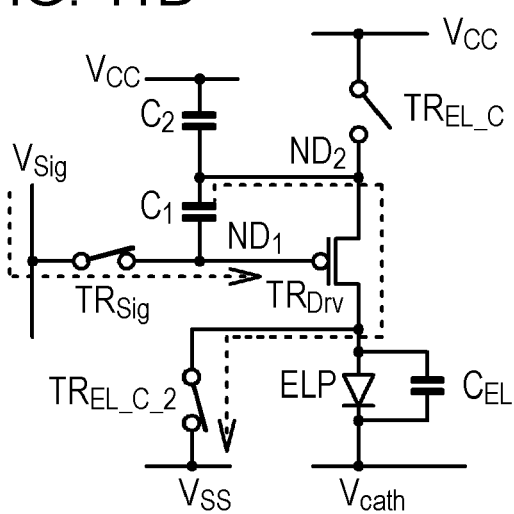

At subsequent time $t_9$, the potential on the scanning line SCL is changed to a low level to bring the image-signal writing transistor $TR_{Sig}$ into an on state (see FIG. 11D). Consequently, the gate potential (G) of the drive transistor TR$_{Drv}$ becomes V$_{Sig}$ that is larger than the threshold voltage V$_{th}$ of the drive transistor TR$_{Drv}$. Because of this, a current flows from the first capacitor C$_1$ to the second light-emission control transistor TR$_{EL\_C\_2}$ via the drive transistor TR$_{Drv}$. This decreases the source potential (S) of the drive transistor TR$_{Drv}$ with the passage of time.

[Time t$_{10}$]

Figure 12A:
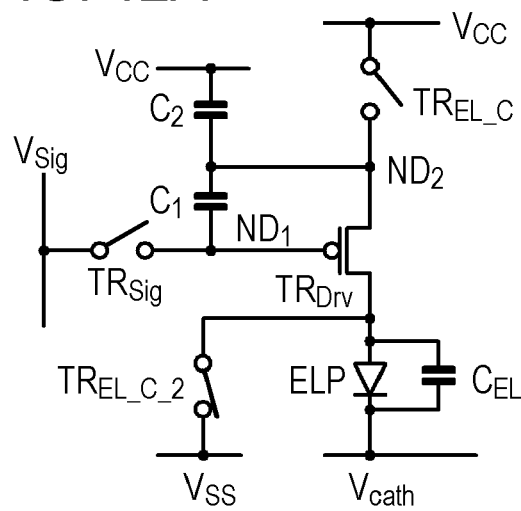

At subsequent time t$_{10}$, the potential on the scanning line SCL is changed to a high level to bring the image-signal writing transistor TR$_{Sig}$ into an off state, thereby completing the writing process on the image signal V$_{Sig}$ (FIG. 12A). That is, the image-signal writing process for writing the image signal V$_{Sig}$ to the gate potential (G) of the drive transistor TR$_{Drv}$ is performed in the period from time t$_9$ to time t$_{10}$ in which the image-signal writing transistor TR$_{Sig}$ is in the on state. Through this process, the potential difference V$_{gs}$ at the drive transistor TR$_{Drv}$ becomes (V$_{th}$+V$_{Sig}$). Note that this value is effective when V$_{ofs}$ is 0 volts.

During the image-signal writing period from time t$_9$ to time t$_{10}$, the mobility μ of the drive transistor TR$_{Drv}$ is simultaneously corrected. Specifically, the gate potential (G) of the drive transistor TR$_{Drv}$ is V$_{Sig}$ during the image-signal writing period; however, a current flows through the drive transistor TR$_{Drv}$ at the same time and therefore the source potential (S) also changes by ΔV. Properly speaking, the potential difference V$_{gs}$ at the drive transistor TR$_{Drv}$ is (V$_{th}$+V$_{Sig}$−ΔV). The change ΔV acts exactly in a direction of canceling the variation in mobility μ of the drive transistor TR$_{Drv}$. Specifically, when the mobility μ of the drive transistor TR$_{Drv}$ is relatively large, the ΔV is large, but the potential difference V$_{gs}$ correspondingly becomes small so that the effect of the mobility μ can be suppressed. On the contrary, when the drive transistor TR$_{Drv}$ has a small mobility μ, the potential difference V$_{gs}$ does not become so small because the ΔV is small. Thus, the potential difference V$_{gs}$ changes depending on the magnitude of the mobility μ so that variations in the mobility μ are averaged. The time (t) for correcting the mobility is very short, like a few micro seconds. The current value I$_{ds}$ after the mobility correction is expressed by Equation (B) as shown above.

[Time t$_{11}$]

Figure 12B:
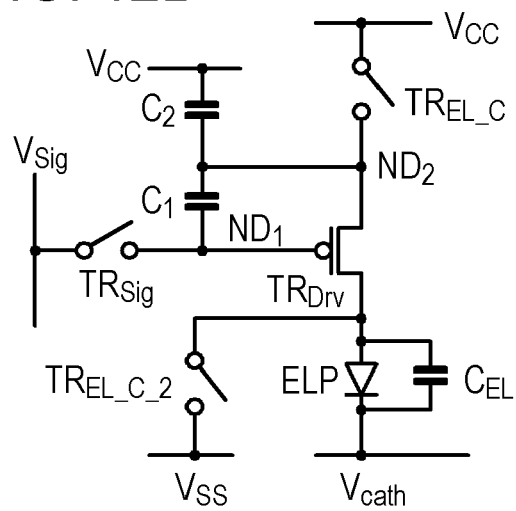

At subsequent time t$_{11}$, the potential on the second light-emission control line CL$_{EL\_C\_2}$ is changed to a high level to bring the second light-emission control transistor TR$_{EL\_C\_2}$ into an off state (see FIG. 12B).

[Time t$_{12}$]

Figure 12C:
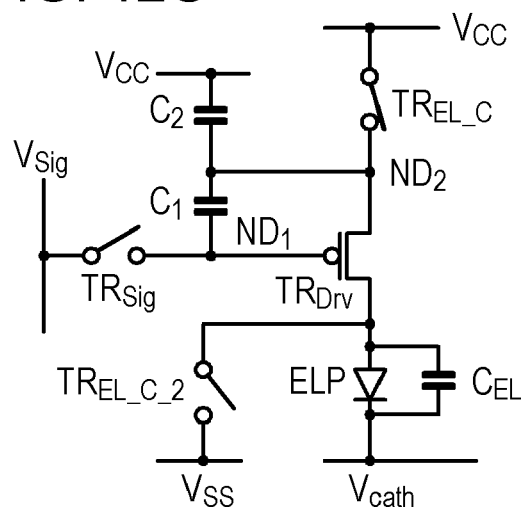

At subsequent time t$_{12}$, the potential on the light-emission control line CL$_{EL\_C}$ is changed to a low level to bring the light-emission control transistor TR$_{EL\_C}$ into an on state (see FIG. 12C). Consequently, the source region of the drive transistor TR$_{Drv}$ is brought into connection with the first current supply unit 101 that in turn starts supplying current to the drive transistor TR$_{Drv}$, thereby allowing the light-emitting section ELP to start emitting light. Since the gate potential (G) of the drive transistor TR$_{Drv}$ also rises due to bootstrap effect at this moment, the potential difference V$_{gs}$ held at the first capacitor C$_1$ maintains a value of (V$_{Sig}$+V$_{th}$−ΔV).

The relationship between the drain current I$_{ds}$ and potential difference V$_{gs}$ at this moment can be expressed by Expressions (4-1) and (4-2) as described above. Since the first source/drain region, which is one of the source/drain regions of the drive transistor TR$_{Drv}$, is electrically connected to the first well, there is no change in threshold voltage caused by the aforementioned substrate effect and the variation in threshold voltage is eventually corrected (canceled) In short, the drain current I$_{ds}$ to be supplied to the light-emitting section ELP is determined basically by image signals V$_{Sig}$ without depending on the threshold voltage V$_{th}$ of the drive transistor TR$_{Drv}$. In other words, the light-emitting section ELP emits light with a luminance corresponding to the image signal V$_{Sig}$. After that, the potential on the light-emission control line CL$_{EL\_C}$ is changed to a high level to bring the light-emission control transistor TR$_{EL\_C}$ into an off state, thereby terminating light emission and completing one field. A transition is thereafter made to the next field to repeat the threshold voltage correction process, image-signal writing process, mobility correction process, and light emitting operation again.

Although the display device and the electronic apparatus according to the embodiments of the present disclosure have been described on the basis of the preferred examples, the display device and the electronic apparatus of the present disclosure are not limited to these examples. The configuration and structure of the display device and the driving circuit in the examples are for illustration and may be appropriately changed. The driving method is also for illustration and may be appropriately changed.

Figure 13:
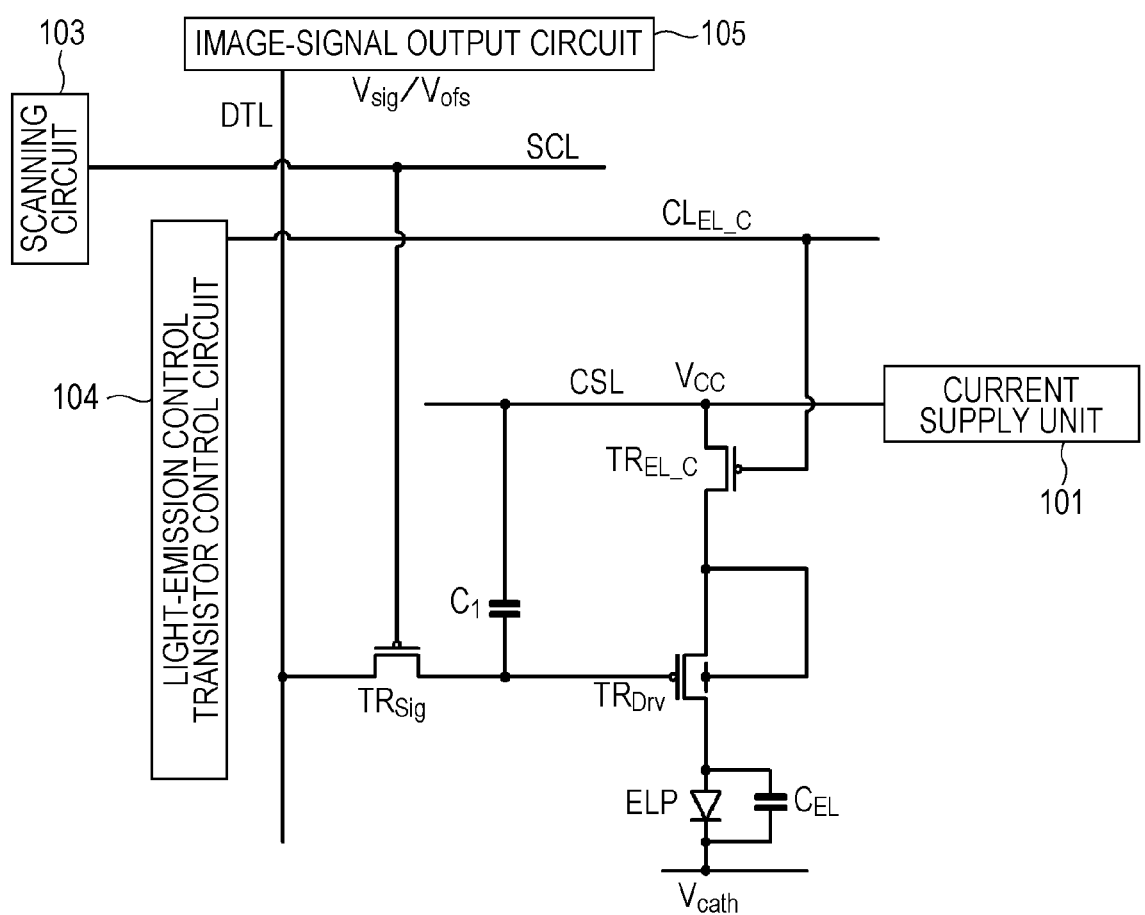
FIG. 13 is an equivalent circuit diagram of a 3Tr/1C driving circuit.
Figure 14:
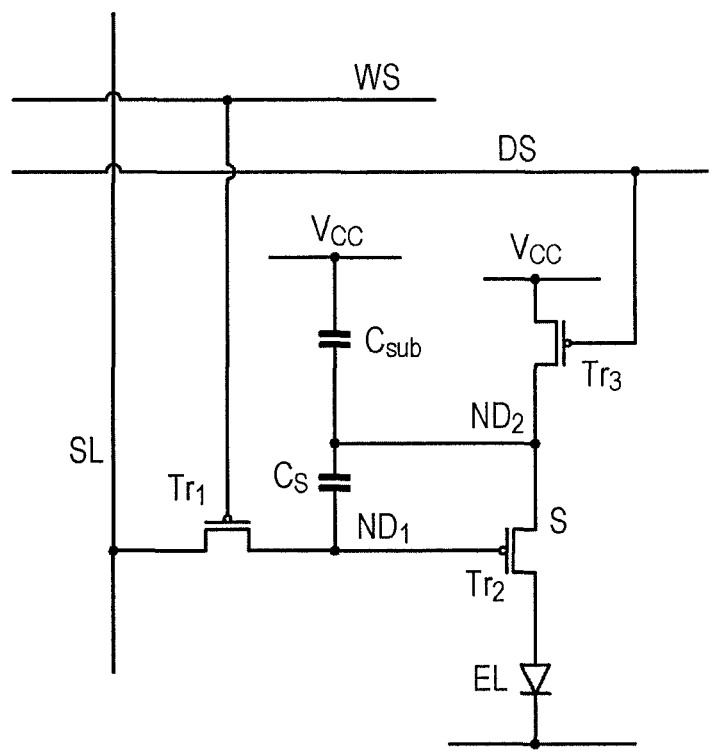
FIG. 14 is an equivalent circuit diagram of a light-emitting element including a driving circuit with three transistors and two capacitors in the past.

For example, as shown in the equivalent circuit diagram of FIG. 13, the driving circuit can be configured to have three transistors (a drive transistor, an image-signal writing transistor, and a light-emission control transistor) and a single capacitor. The detailed operation of the driving circuit is described in Japanese Unexamined Patent Application Publication No. 2011-209434. In the driving circuit, one end of the capacitor C$_1$ is directly connected to the light-emission control line CL$_{EL\_C}$. In addition, a high potential V$_H$ (fixed value) is applied to the light-emission control line CL$_{EL\_C}$ from the light-emission control transistor control circuit 104 when a writing process of image signals V$_{Sig}$ is performed and a drain current I$_{ds}$ is supplied to the drive transistor TR$_{Drv}$, whereas a low potential V$_L$ (fixed value) is applied anytime other than the time described above. When the threshold voltage of the light-emitting section ELP is V$_{th-EL}$, $V_H \geq V_{th-EL} + V_{cath}$ $V_L < V_{th-EL} + V_{cath}$.

Although the respective transistors in the examples are p-channel transistors, the transistors, except for the driving transistor, may be occasionally replaced with n-channel transistors. The display device according to the embodiment of the present disclosure may be applied to, for example, a television receiver, a monitor included in a digital camera, a monitor included in a video camera, a monitor included in a personal computer, various display units in a personal digital assistant (PDA), a mobile phone, a smart phone, a portable music player, a game machine, an electronic book, and an electronic dictionary, an electronic view finder (EVF), and a head mounted display (HMD). That is, examples of the electronic apparatus according to the embodiment of the present disclosure include a television receiver, a digital camera, a video camera, a personal computer, a PDA, a mobile phone, a smart phone, a portable music player, a game machine, an electronic book, an electronic dictionary, an electronic view finder, and a head mounted display. The display device according to the embodiment of the present disclosure is provided in these electronic apparatuses. Although the organic electroluminescence light-emitting section has been described as a display unit in the examples, the light-emitting section may be other types of the self-luminous light-emitting section, such as an inorganic electroluminescence light-emitting section, an LED light-emitting section, and a semiconductor laser light-emitting section.

The present disclosure may have the following configurations.

[1] <Light-Emitting Element>

A light-emitting element including a light-emitting section and a driving circuit that drives the light-emitting section, wherein
the driving circuit includes at least:
  (A) a drive transistor that is a p-channel field effect transistor;
  (B) an image-signal writing transistor that is a p-channel field effect transistor;
  (C) a light-emission control transistor that is a p-channel field effect transistor; and
  (D) a capacitor, wherein
  each of the drive transistor, image-signal writing transistor, and light-emission control transistor is provided in an n-type well formed in a p-type silicon semiconductor substrate, and
  a first source/drain region of the drive transistor is electrically connected to the n-type well in which the drive transistor is formed.

[2] The light-emitting element recited in [1], wherein
the drive transistor includes:
  (A-1) a first source/drain region connected to a second source/drain region of the light-emission control transistor;
  (A-2) a second source/drain region connected to the light-emitting section; and
  (A-3) a gate electrode connected to a second source/drain region of the image-signal writing transistor and also connected to a second end of the capacitor to form a first node,
the image-signal writing transistor includes:
  (B-1) a first source/drain region connected to a data line; and
  (B-2) a gate electrode connected to a scanning line,
the light-emission control transistor includes:
  (C-1) a first source/drain region connected to a current supply line; and
  (C-2) a gate electrode connected to a light-emission control line, and
the capacitor includes a first end connected to a second current supply line.

[3] The light-emitting element recited in [2], further including a second capacitor, wherein
the first end of the capacitor is connected to the second current supply line through the second capacitor and also connected to the first source/drain region of the drive transistor and the second source/drain region of the light-emission control transistor.

[4] <Display Device>

A display device including a plurality of the light-emitting elements recited in any one of [1] to [3], the light-emitting elements being arranged in a two-dimensional matrix.

[5] <Electronic Apparatus>

An electronic apparatus including the display device recited in [4].

What is claimed is:
1. A light-emitting element, comprising:
  a light-emitting section; and
  a driving circuit configured to drive the light-emitting section,
  wherein the driving circuit includes:
    a drive transistor that is a first p-channel field effect transistor,
    an image-signal writing transistor that is a second p-channel field effect transistor,
    a first light-emission control transistor that is a third p-channel field effect transistor,
    a first capacitor that includes a first electrode and a second electrode, and
    a second light-emission control transistor that is a fourth p-channel field effect transistor,
  wherein each of the drive transistor, the image-signal writing transistor, and the first light-emission control transistor is in an n-type well that is in a p-type silicon semiconductor substrate,
  wherein one of a first source region of the drive transistor or a first drain region of the drive transistor is electrically connected to the n-type well, which has the drive transistor, through the first electrode of the first capacitor, and
  wherein the second light-emission control transistor includes a gate electrode connected to a first light-emission control line.

2. The light-emitting element according to claim 1, wherein
the drive transistor includes:
  one of the first source region of the drive transistor or the first drain region of the drive transistor connected to one of a first source region of the first light-emission control transistor or a first drain region of the first light-emission control transistor,
  one of a second source region or a second drain region connected to the light-emitting section, and
  a gate electrode connected to one of a first source region of the image-signal writing transistor or a first drain region of the image-signal writing transistor, and connected to the second electrode of the first capacitor,
the image-signal writing transistor includes:
  one of a second source region or a second drain region connected to a data line, and
  a gate electrode connected to a scanning line, the first light-emission control transistor includes:
    one of a second source region or a second drain region connected to a first current supply line, and
    a gate electrode connected to a second light-emission control line, and
the first electrode of the first capacitor is connected to a second current supply line.

3. The light-emitting element according to claim 2, further comprising a second capacitor,
  wherein the first electrode of the first capacitor is connected to the second current supply line through the second capacitor,
  wherein the first electrode of the first capacitor is further connected to one of the first source region of the drive transistor or the first drain region of the drive transistor, and
  wherein the first electrode of the first capacitor is further connected to one of the second source region of the first light-emission control transistor or the second drain region of the first light-emission control transistor.

4. The light-emitting element according to claim 1, wherein the second light-emission control transistor includes one of a first source region or first drain region connected to one of a second source region of the drive transistor or a second drain region of the drive transistor.

5. A display device, comprising:
a plurality of light-emitting elements,
wherein the plurality of light-emitting elements are present in a two-dimensional matrix, and
wherein a light-emitting element of the plurality of light-emitting elements comprises:
  a light-emitting section; and
  a driving circuit configured to drive the light-emitting section,
    wherein the driving circuit includes:
      a drive transistor that is a first p-channel field effect transistor,
      an image-signal writing transistor that is a second p-channel field effect transistor,
      a first light-emission control transistor that is a third p-channel field effect transistor,
      a first capacitor that includes a first electrode and a second electrode, and
      a second light-emission control transistor that is a fourth p-channel field effect transistor,
    wherein each of the drive transistor, the image-signal writing transistor, and the first light-emission control transistor is in an n-type well that is in a p-type silicon semiconductor substrate,
    wherein one of a first source region of the drive transistor or a first drain region of the drive transistor is electrically connected to the n-type well, which has the drive transistor, through the first electrode of the first capacitor, and
    wherein the second light-emission control transistor includes a gate electrode connected to a light-emission control line.

6. An electronic apparatus, comprising a display device, wherein the display device comprises:
a plurality of light-emitting elements,
wherein the plurality of light-emitting elements are present in a two-dimensional matrix, and
wherein a light-emitting element of the plurality of light-emitting elements comprises:
  a light-emitting section; and
  a driving circuit configured to drive the light-emitting section,
    wherein the driving circuit includes:
      a drive transistor that is a first p-channel field effect transistor,
      an image-signal writing transistor that is a second p-channel field effect transistor,
      a first light-emission control transistor that is a third p-channel field effect transistor,
      a first capacitor that includes a first electrode and a second electrode, and
      a second light-emission control transistor that is a fourth p-channel field effect transistor,
    wherein each of the drive transistor, the image-signal writing transistor, and the first light-emission control transistor is in an n-type well that is in a p-type silicon semiconductor substrate,
    wherein one of a first source region of the drive transistor or a first drain region of the drive transistor is electrically connected to the n-type well, which has the drive transistor, through the first electrode of the first capacitor, and
wherein the second light-emission control transistor includes a gate electrode connected to a light-emission control line.

\* \* \* \* \*